(12) United States Patent
Omura

(10) Patent No.: US 6,903,803 B2
(45) Date of Patent: Jun. 7, 2005

(54) PROJECTION OPTICAL SYSTEM, EXPOSURE APPARATUS INCORPORATING THIS PROJECTION OPTICAL SYSTEM, AND MANUFACTURING METHOD FOR MICRO DEVICES USING THE EXPOSURE APPARATUS

(75) Inventor: Yasuhiro Omura, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/726,494

(22) Filed: Dec. 4, 2003

(65) Prior Publication Data

US 2004/0119962 A1 Jun. 24, 2004

Related U.S. Application Data

(63) Continuation of application No. 09/865,734, filed on May 29, 2001, now abandoned.

(30) Foreign Application Priority Data

May 30, 2000 (JP) ..................................... P2000-160897

(51) Int. Cl.[7] .......................... G03B 27/54; G03B 27/42
(52) U.S. Cl. .......................................... 355/67; 355/53
(58) Field of Search ............................. 355/52, 53, 55, 355/67–69; 359/365, 571, 649, 754

(56) References Cited

U.S. PATENT DOCUMENTS

| | | | |
|---|---|---|---|
| 5,170,207 A | 12/1992 | Tezuka et al. | |
| 5,623,365 A | 4/1997 | Kuba | |
| 5,636,000 A | 6/1997 | Ushida et al. | |
| 5,748,372 A | 5/1998 | Kitagawa | |
| 5,754,340 A | 5/1998 | Ushida et al. | |
| 6,285,512 B1 * | 9/2001 | Sudoh | 359/704 |
| 6,313,958 B1 | 11/2001 | Ogawa | |
| 6,349,005 B1 | 2/2002 | Schuster et al. | |

FOREIGN PATENT DOCUMENTS

| | | |
|---|---|---|
| JP | 04-214516 | 8/1992 |
| JP | 05-150107 | 6/1993 |
| JP | 05-297209 | 11/1993 |
| JP | 06-331941 | 12/1994 |
| JP | 07-128590 | 5/1995 |
| JP | 08-017719 | 1/1996 |
| JP | 11-194479 | 7/1999 |
| JP | 11-307443 | 11/1999 |
| JP | 2000-012453 | 1/2000 |
| JP | 2000-029202 | 1/2000 |
| WO | WO99/34255 | 7/1999 |
| WO | WO99/50712 | 10/1999 |
| WO | WO99/66370 | 12/1999 |

* cited by examiner

*Primary Examiner*—Henry Hung Nguyen
(74) *Attorney, Agent, or Firm*—Finnegan, Henderson, Farabow, Garrett & Dunner, L.L.P.

(57) ABSTRACT

In a projection optical system which forms an image of a first plane on a second plane, using extreme ultraviolet illumination light, an object of the invention is to form an image of the first plane on the second plane under suitable conditions. This projection optical system includes a first diffractive optical element arranged in an optical path between the first plane and the second plane; a second diffractive optical element arranged in the optical path on the side of the second plane from the first diffractive optical element; and an optical system having a negative power, arranged in the optical path between the first diffractive optical element and the second diffractive optical element.

16 Claims, 12 Drawing Sheets

PROJECTION OPTICAL SYSTEM, EXPOSURE APPARATUS INCORPORATING THIS PROJECTION OPTICAL SYSTEM, AND MANUFACTURING METHOD FOR MICRO DEVICES USING THE EXPOSURE APPARATUS

This is a continuation of application Ser. No. 09/865,734, filed May 29, 2001 now abandoned.

BACKGROUND OF THE INVENTION

1. Field of the Invention

The present invention relates to a projection optical system for forming an image of a first plane on a second plane, an exposure apparatus incorporating this projection optical system and used at the time of transferring a mask pattern onto a substrate in a lithography process for manufacturing devices or micro devices, such as semiconductor devices or liquid-crystal display devices, and a manufacturing method for micro devices using this exposure apparatus to manufacture micro devices such as semiconductor devices, imaging devices, liquid-crystal display devices or thin film magnetic heads.

2. Description of the Related Art

When micro devices such as semiconductor devices are manufactured, there are used a batch exposure type projection exposure apparatus (stepper or the like) in which a minute pattern image formed on a reticle as a mask is transferred onto a wafer (or a glass plate) on which a resist is applied, via a projection optical system, or a scanning exposure type projection exposure apparatus involving a step and scan method. In order to form a minute pattern on a wafer or the like, it is necessary to increase the resolution of a pattern image of the reticle obtained by irradiating an illumination light onto the reticle.

As a method of increasing the resolution of the pattern image, there is a method involving making the illumination light mainly emitted from a light source a short wavelength, and a method involving designing the numerical aperture (NA) of the projection optical system to be high. However, even if the numerical aperture of the projection optical system is increased over and above what is required, if illumination light having a long wavelength is used, there is naturally a limit to improvement of the resolution. Therefore, it is basically necessary to make the wavelength of the illumination light short. Heretofore, as the wavelength of illumination light, a g ray (436 nm) or an i ray (365 nm) has been often used. At present, however, the wavelength of illumination light has been made shorter, and a laser beam (248 nm) emitted from a KrF excimer laser or a laser beam (193 nm) emitted from an ArF excimer laser is now being used. Moreover, a projection optical system which can be used under exposure light having such a short wavelength is under development.

In evaluating the performance of the projection optical system, it is important to have a high numerical aperture, since this becomes an index for obtaining a high resolution. However, even if the numerical aperture is high, if aberration occurs, there is a problem in forming minute patterns. Here, description is made of chromatic aberration, as one example of aberration. Since the optical performance of a projection optical system used in applications for forming minute patterns is quite high, it becomes necessary to make each aberration substantially zero. In order to make chromatic aberration zero, the projection optical system has been heretofore realized by a dioptric system constituted by only lens groups. This method however, requires a multiplicity of lenses, and hence invites a reduction in transmittance, and an increase in the cost for manufacturing the projection optical system cannot be avoided. Moreover, as is generally known, the condition for making curvature aberration of an image surface zero is to satisfy the Petzval's condition. In order to satisfy this condition however, it is necessary to combine not only lenses having a positive power but also lenses having a negative power. As a result, this is not desirable in view of improving transmittance and cost reduction.

As compared with dioptric optical elements such as lenses, in the diffractive optical elements, the reaction of chromatic aberration is in a direction opposite to that for the normal dioptric optical element. Therefore, by merely mixing the dioptric optical elements and the diffractive optical elements, chromatic aberration can be corrected. Moreover, since the diffractive optical element since power can be set to a predetermined value without making any contribution to the Petzval's condition, it is possible to make the image surface flat, designating curvature aberration as zero, without causing an increase in the number of the dioptric optical elements. Also, since the diffractive optical element can optionally set the angle of diffraction, this has an advantage in that it can be prepared as an optical element having a similar action to that of an aspherical lens.

As described above, by using the diffractive optical element, chromatic aberration can be corrected and curvature aberration can be made zero, without causing an increase in the number of the dioptric optical lenses. This result is especially suitable for improving transmittance of the projection optical system and reducing the cost. A technique adopting such an optical system combining the diffractive optical element and the dioptric lens for the projection optical system for semiconductor manufacturing apparatus has been disclosed in, for example, Japanese Unexamined Patent Application, First Publication Nos. Hei 1-307443, Hei 4-214516, Hei 6-331941, Hei 7-128590 and Hei 8-17719.

Below is a description of optical characteristic of the diffractive optical element. At the time of using the diffractive optical element, it is preferred to use a phase-type diffractive optical element (kinoform), in view of diffraction efficiency, and in view of ease of production the cross-section of the diffractive optical element should preferably be in a saw-tooth pattern (blazed type) or a stepwise pattern (binary optical element). Diffraction efficiency in this case stands for an intensity ratio between light incident on the diffractive optical element and diffracted light after predetermined order. With the diffractive optical element having a cross-section in a saw-tooth pattern or a stepwise pattern, occurrence of unnecessary diffracted light which does not contribute to image forming cannot be avoided due to form error or the like. However, as disclosed in, for example, Japanese Unexamined Patent Application, First Publication No. Hei 11-307443, when this unnecessary diffracted light has an intensity ratio and an intensity distribution of a desired numerical value or below, the influence thereof on the imaging performance can be substantially ignored.

When the wavelength of illumination light becomes short with shortening of the wavelength of the light source, the kinds of usable glass material are limited due to absorption of light, and if the wavelength becomes 180 nm or below, the only glass material practically usable is fluorite. Therefore, under illumination light having such a short wavelength, correction of chromatic aberration becomes impossible with a construction having only dioptric lenses. Hence it is necessary to perform correction of chromatic aberration, using a diffractive optical element.

Moreover, when the exposure wavelength becomes ultraviolet light, it is necessary to form the ring width (pitch) around the diffractive optical element to be very small in order to obtain effective power for correcting the chromatic aberration, using the diffractive optical element. Hence the production thereof becomes difficult. In such a case, a diffractive optical element which obtains the power of the diffractive optical element within a range capable of production and reduces an occurrence of unnecessary diffracted light as much as possible, and a projection optical system using this diffractive optical element are disclosed in Japanese Unexamined Patent Application, First Publication Nos. Hei 5-150107, Hei 5-297209 and Hei 6-331941.

However, for a projection optical system for forming a pattern having a resolution of 0.1 μm or less, using extreme ultraviolet illumination light having a large numerical aperture, measures have not heretofore been taken for exhibiting sufficient imaging performance, taking into consideration incident angle characteristics and manufacturing error of the diffractive optical element.

In view of the above situation, a first object of the present invention is to provide a projection optical system that can form an image of a first plane on a second plane under suitable conditions, using extreme ultraviolet illumination light. Also, a second object of the present invention is to provide a projection optical system that can achieve the first object without causing a cost increase. Moreover, a third object of the present invention is to provide an exposure apparatus comprising such a projection optical system, which can form a minute pattern of 0.1 μm or less on a wafer arranged on the second plane, and to provide a manufacturing method for micro devices, using this exposure apparatus.

SUMMARY OF THE INVENTION

In order to solve the above problems, a first aspect of the present invention is a projection optical system (PL) for forming an image on a first plane (P1) on a second plane (P2), comprising: a first diffractive optical element (D1) arranged in an optical path between the first plane (P1) and the second plane (P2); a second diffractive optical element (D2) arranged in the optical path on the side of the second plane (P2) from the first diffractive optical element (D1); and an optical system (G2) having a negative power, arranged in the optical path between the first diffractive optical element (D1) and the second diffractive optical element (D2).

According to this projection optical system, an optical system having a negative power is arranged in the optical path between the first diffractive optical element and the second diffractive optical element, so as to adjust the angle of incidence of the luminous flux which is incident to the second diffractive optical element. Therefore, the luminous flux can be diffracted according to the diffraction characteristic of the second diffractive optical element, and as a result, the image on the first plane can be formed on the second plane with high precision. Hence, the system is especially suitable for forming an image of a minute pattern, in particular, a pattern of 0.1 μm or less on the second plane.

Moreover, this projection optical system (PL) further comprises: a front optical system (G1) arranged in an optical path between the first plane (P1) and the first diffractive optical element (D1); and a rear optical system (G3) arranged in an optical path between the second diffractive optical element (D2) and the second plane (P2); and the front optical system (G1) converts an axial luminous flux on the first plane (P1) to substantially parallel luminous flux, and guides the parallel luminous flux to the first diffractive optical element (D1); and the optical system (G2) having a negative power converts an axial luminous flux on the first plane (P1) via the first diffractive optical element (D1) again to substantially parallel luminous flux, and guides the parallel luminous flux to the second diffractive optical element (D2).

According to this projection optical system, the axial luminous flux on the first plane is converted to a substantially parallel luminous flux, and shone onto the first diffractive optical element, and the axial luminous flux on the first plane via the first diffractive optical element is again converted to a substantially parallel luminous flux and guided to the second diffractive optical element. As a result, the image on the first plane can be formed on the second plane with high precision. Moreover, the first diffractive optical element and the second diffractive optical element have a chromatic aberration characteristic opposite to that of a chromatic aberration caused by the front optical system, the rear optical system and the optical system having a negative power, and do not affect the Petzval's condition. Hence the chromatic aberration can be corrected favorably. As a result, the system is especially suitable for forming an image on the first plane on the second plane with high precision. Furthermore, since correction of chromatic aberration is performed only by the diffractive optical element, several lenses arranged in the optical path for correcting the chromatic aberration are not required, thereby keeping down cost increase. Also, even if chromatic aberration cannot be corrected by lenses, due to a restriction on the glass material of the lenses, chromatic aberration can be corrected by using a diffractive optical element having an aberration characteristic opposite to that of lenses. Furthermore, since two diffractive optical elements, namely the first diffractive optical element and the second diffractive optical element, are used to obtain a power required for correction of chromatic aberration by each diffractive optical element, even if values of chromatic aberration in the front optical system, the rear optical system and the optical system having a negative power are varied, chromatic aberration can be properly corrected.

Furthermore, a second aspect of the present invention is a projection optical system (PL) for forming an image on a first plane (P1) on a second plane (P2), comprising: diffractive optical elements (D1, D2) arranged in an optical path between the first plane (P1) and the second plane (P2); and optical systems (G1, G2) arranged in an optical path between the first plane (P1) and the diffractive optical elements (D1, D2), wherein when a numerical aperture on the side of the second plane (P2) of the projection optical system (PL) is designated as NA, an imaging magnification of the optical systems (G1, G2) from the first plane (P1) to immediately before the diffractive optical elements (D1, D2) is designated as β, the focal length of the diffractive optical elements (D1, D2) with respect to a predetermined wavelength is designated as f, and the distance from the first plane (P1) to the second plane (P2) is designated as L, the projection optical system satisfies the following conditions:

$$1/|NA \cdot \beta| < 0.7$$

$$0.38 < f/L < 1.2.$$

According to this projection optical system, by satisfying the above described conditions, a projection optical system having a large numerical aperture, but having no imaging performance degradation due to the angular characteristic can be realized. Hence sufficient correction of chromatic aberration can be realized. Moreover, by satisfying the above described conditions, the pitch of the diffractive optical elements is not refined so much, and diffractive optical elements having a relatively wide pitch and which are easy to manufacture can be used.

Furthermore, a third aspect of the present invention is a projection optical system (PL) having a plurality of optical elements arranged along an optical path between a first plane (P1) and a second plane (P2) for forming an image on the first plane (P1) on the second plane (P2), wherein at least one diffractive optical element (D1, D2) having a diffraction pattern surface (PL1, PL11) formed on one surface and a correction surface (PL2, PL22) formed on an other surface is arranged along the optical path, and the correction surface (PL2, PL12) corrects a manufacturing error on the diffraction pattern surface (PL1, PL11).

According to this projection optical system, since a correction surface for correcting a manufacturing error on the diffraction pattern surface is formed on the diffractive optical element, the system is especially suitable as a diffraction grating used for a projection optical system where extremely high precision imaging characteristics are required.

Moreover, this projection optical system (PL) is characterized in that the correction surface (PL2, PL12) has a slightly aspheric surface which has been subjected to aspheric surface processing with a sag amount of 0.5 $\mu$m or less with respect to a predetermined reference plane, and that the reference plane is a flat or spherical surface.

The present invention is also characterized in that in the projection optical system (PL) according to the first to third aspects of the invention, all the diffraction patterns of the diffractive optical elements (D1, D2) are formed on a flat substrate.

Moreover, the present invention is characterized in that in the projection optical system (PL) according to the first to third aspects of the invention, diffraction patterns of the diffractive optical elements (D1, D2) are formed in a plurality of ring areas centered on an optical axis (AX), each ring area being formed of a binary optical element approximated in a plurality of stages by a plurality of surfaces, and the binary optical element formed in each ring area has a positive power, respectively. Here, it is desired that of respective binary optical elements respectively formed in each ring area, at least one stage is made different from others, or that a filter having a different transmittance according to each ring area is arranged in the vicinity of the diffractive optical element.

The present invention is also characterized in that in the projection optical system (PL) according to the first to third aspects of the invention, the diffraction patterns of the diffractive optical elements (D1, D2) are formed in a plurality of ring areas centered on an optical axis (AX), and each of the respective ring areas has a sawtooth cross-section having a positive power. Here, it is desired that the diffraction pattern of the diffractive optical element is formed in a first ring area and a second ring area, centered on a mutual optical axis, the first ring area being formed on the side of the optical axis from the second ring area, and having a sawtooth cross-section in which the diffraction efficiency becomes highest with regard to the 1st or −1st diffracted light, and the second ring area being formed on the side of the peripheral from the first ring area, and having a sawtooth cross-section in which the diffraction efficiency becomes highest with regard to the mth or −mth diffracted light (m is an integer equal to or greater than 2).

Also, it is desired that the plurality of optical elements constituting the projection optical system (PL) of the above described first to third aspects of the invention have lenses contributing to forming an image on the first plane (P1) on the second plane (P2), and that all the lenses constituting the projection optical system be constituted of fluorite. Moreover, it is desired that the optical system (G2) having a negative power has an aspheric surface.

Furthermore, the projection optical system (PL) of a fourth aspect of the invention is characterized in that a plurality of optical elements are respectively arranged along an optical path between a first plane and a second plane for forming an image on the first plane (P1) on the second plane (P2), and at least one of these plurality of optical elements has an optical surface (PL1) formed on one surface and a correction surface (PL2) formed on an other surface, and the correction surface (PL2) corrects a manufacturing error on the optical surface (PL1).

According to this projection optical system, since a manufacturing error on the optical surface formed on the optical element is corrected by means of the correction surface, the system is especially suitable as an optical element used for a projection optical system wherein an image quality having extremely high precision is required.

In the projection optical system (PL) of the above fourth aspect of the invention, it is desired that the correction surface (PL2) has a slightly aspheric surface which has been subjected to aspheric surface processing with a sag amount of 0.5 $\mu$m or less with respect to a predetermined reference plane.

Furthermore, the projection optical system (PL) of the second aspect of the invention according to the present invention is characterized in that an optical system (G3) having a positive power is arranged in the optical path between the diffractive optical element (D1, D2) and the second plane (P2), and the optical system (G1) arranged in the optical path between the first plane (P1) and the diffractive optical element (D1, D2) has a positive power.

An exposure apparatus of the present invention is characterized by comprising: a mask stage (14) for setting a mask (R) having a predetermined pattern formed thereon on the first plane (P1); a substrate stage (22) for setting a photosensitive substrate (W) on the second plane (P2); an illumination optical system (10, IL) for illuminating the mask (R) set on the first plane (P1); and a projection optical system according to either one of the above first to fourth aspects of the invention, for performing projection exposure of a pattern image of the mask (R) on the photosensitive substrate (W).

According to this exposure apparatus, the pattern image formed on the mask arranged on the first plane can be formed with high precision on the photosensitive substrate arranged on the second plane. As a result, the apparatus is extremely suitable for forming a minute pattern, especially, a minute pattern of 0.1 $\mu$m or less on the wafer.

A manufacturing method for micro devices according to the present invention is characterized by including: a first setting step for setting a mask (R) having a predetermined pattern on the first plane (P1); a second setting step for setting a photosensitive substrate (W) on the second plane (P2); an illumination step for illuminating the mask (R); an exposure step for performing projection exposure of the pattern image of the mask (R) on the photosensitive substrate (W), using a projection optical system according to either one of the above first to fourth aspects of the invention; and a development step for developing the photosensitive substrate (W) to which the image has been transferred.

According to this manufacturing method for micro devices, as in the above described exposure apparatus, the pattern image formed on the mask arranged on the first plane can be formed with high precision on the photosensitive substrate arranged on the second plane. As a result, the method is extremely suitable for manufacturing micro devices where it is necessary to form a minute pattern, especially, a minute pattern of 0.1 μm or less on the wafer.

PREFERRED EMBODIMENTS

A projection optical system according to the embodiments of the present invention, an exposure apparatus comprising this projection optical system and a manufacturing method for micro devices using this exposure apparatus will now be described in detail, with reference to drawings.

Figure 1:
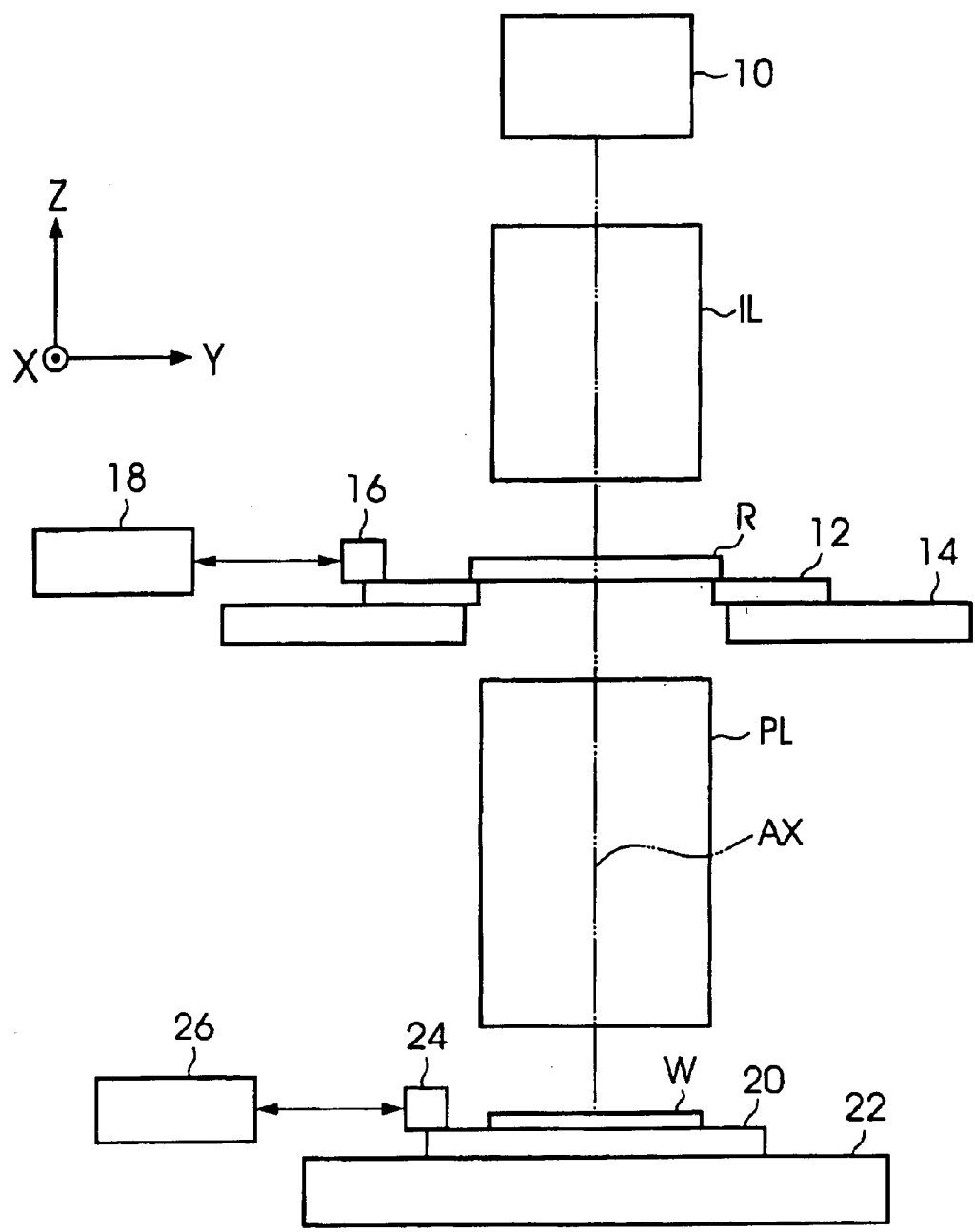
FIG. 1 is a diagram showing a schematic construction of an exposure apparatus according to one embodiment of the present invention, comprising a projection optical system according to one embodiment of the present invention.

FIG. 1 is a diagram showing a schematic construction of an exposure apparatus according to one embodiment of the present invention, comprising a projection optical system according to one embodiment of the present invention. In this embodiment, description is made for a case where a cata-dioptric system is used as the projection optical system. In the description below, an XYZ rectangular coordinate system shown in FIG. 1 is set, and positional relation between respective members is described, with reference to this XYZ rectangular coordinate system. The XYZ rectangular coordinate system is set such that the Y-axis and the Z-axis are parallel to the page, and the X-axis is perpendicular to the page. Also in the cata-dioptric system constituting the projection optical system PL as the projection optical system according to one embodiment of the present invention, the reference optical axis AX is set to be parallel to the Z-axis. However, in the XYZ coordinate system in the figure, the X-Y plane is actually set on a plane parallel to the horizontal plane, and the Z-axis is set in the perpendicular direction. In this specification, the term "power" is not limited to refracting power of the diffractive optical element, and is used as a word meaning an inverse number of the focal length. Therefore, the term "power" also means an inverse number of the focal length of, for example, a reflecting type diffractive optical element.

The exposure apparatus shown in FIG. 1 comprises a light source 10 for supplying illumination light in the ultraviolet region. For this light source 10, for example, a KrF excimer laser (emission wavelength: 248 nm), an ArF excimer laser (emission wavelength: 193 nm) or an $F_2$ excimer laser (emission wavelength: 157.624 nm) is used. The light emitted from the light source 10 uniformly illuminates a reticle R having a predetermined pattern formed thereon, via an illumination optical system IL. The optical path between the light source 10 and the illumination optical system IL is sealed with a casing (not shown), and the space from the light source 10 up to the optical member closest to the reticle R side in the illumination optical system IL is replaced with an inert gas such as helium or nitrogen, being a gas having a low rate of absorption of the exposure light, or is substantially held in a vacuum condition.

The reticle R serving as a mask, is held on a reticle stage 14 serving as a mask stage, via a reticle holder 12, in parallel to the X-Y plane, and is set on the first plane referred to in the present invention. A predetermined pattern to be transferred is formed on the reticle R, and of the whole pattern area, a rectangular (slit-shaped) pattern area having a long side along the X-axis direction and a narrow side along the Y-axis direction is illuminated. The reticle stage 14 is two-dimensionally movable along the plane of the reticle (that is, the X-Y plane) by operation of a drive system (not shown), and the position coordinate thereof is measured by an interferometer 18 using a reticle movable mirror 16, and the position is controlled.

The pattern image formed on the reticle R forms a reticle pattern image on a wafer W serving as a photosensitive substrate, via a cata-dioptric projection optical system PL. The wafer W is held in parallel to the X-Y plane on a wafer stage 22 serving as a substrate stage, via a wafer holder 20, and the surface thereof is set on the second plane referred to in the present invention. Then, the pattern image is formed in a rectangular exposure area having a long side along the X-axis direction and a narrow side along the Y-axis direction on the wafer W, so as to optically correspond to the rectangular illumination area. The wafer stage 22 is two-dimensionally movable along the plane of the wafer (that is, the X-Y plane) by operation of a drive system (not shown), and the position coordinate thereof is measured by an interferometer 26 using a wafer movable mirror 24, and the position is controlled.

The construction is also such that the inside of the projection optical system PL is kept in an airtight condition, between the optical member arranged closest to the reticle side and the optical member arranged closest to the wafer W side, of the optical members constituting the projection optical system PL provided in the exposure apparatus shown in FIG. 1, and the inside of the projection optical system PL is replaced with an inert gas such as helium or nitrogen, or is substantially held in the vacuum condition. Moreover, in the narrow optical path between the illumination optical system IL and the projection optical system PL, the reticle R, the reticle stage 14 and the like are arranged. The inside of a casing (not shown) for sealing and enclosing the reticle R, the reticle stage 14 and the like is filled with an inert gas such as nitrogen or helium gas, or is substantially held in the vacuum condition. Also, on the projecting surface side of the projection optical system PL, there are arranged the wafer W, the wafer stage 22, and the like, and the inside of a casing (not shown) for sealing and enclosing the wafer W, the wafer stage 22 and the like is filled with an inert gas such as nitrogen or helium gas, or is substantially held in the vacuum condition. In this manner, an atmosphere in which the exposure light is hardly absorbed is formed throughout the optical path from the light source 10 to the wafer W.

As described above, the illumination area on the reticle R and the exposure area on the wafer W (that is, the effective exposure area) regulated by the projection optical system PL is in a rectangular shape having a narrow side along the Y-axis direction. Therefore, while performing position control of the reticle R and the wafer W, using the drive system and the interferometers 18, 26, by synchronously moving (scanning) the reticle stage 14 and the wafer stage 22 and consequently, the reticle R and the wafer W in the same direction (that is, toward the same direction), in the direction of the narrow side of the rectangular exposure area and the illumination area, that is, along the Y-axis direction, a pattern formed on the reticle R is scanned and exposed on the area on the wafer, having a width equal to the long side of the exposure area and having a length corresponding to the scanning amount (shift amount) of the wafer W.

In the above description, description has been made of an exposure apparatus of the so-called step and scan method, wherein the reticle R and the wafer W are synchronously moved with respect to the projection optical system PL, and a pattern formed on the reticle R is transferred onto the wafer W. However, this may be exposure apparatus of the so-called step and repeat method (a so-called stepper). The step and repeat method is a method wherein the operation is repeated such that a wafer stage 22 is driven step by step, to thereby adjust the position of either one of a plurality of shot areas set on the wafer W with respect to the projection area of the projection optical system PL, and the pattern image formed on the reticle R is transferred onto the positioned shot area.

The exposure apparatus according to one embodiment of the present invention has been roughly described above. A projection optical system according to the one embodiment of the present invention, provided in the exposure apparatus according to one embodiment of the present invention will now be described in detail, with reference to drawings.

Figure 2:
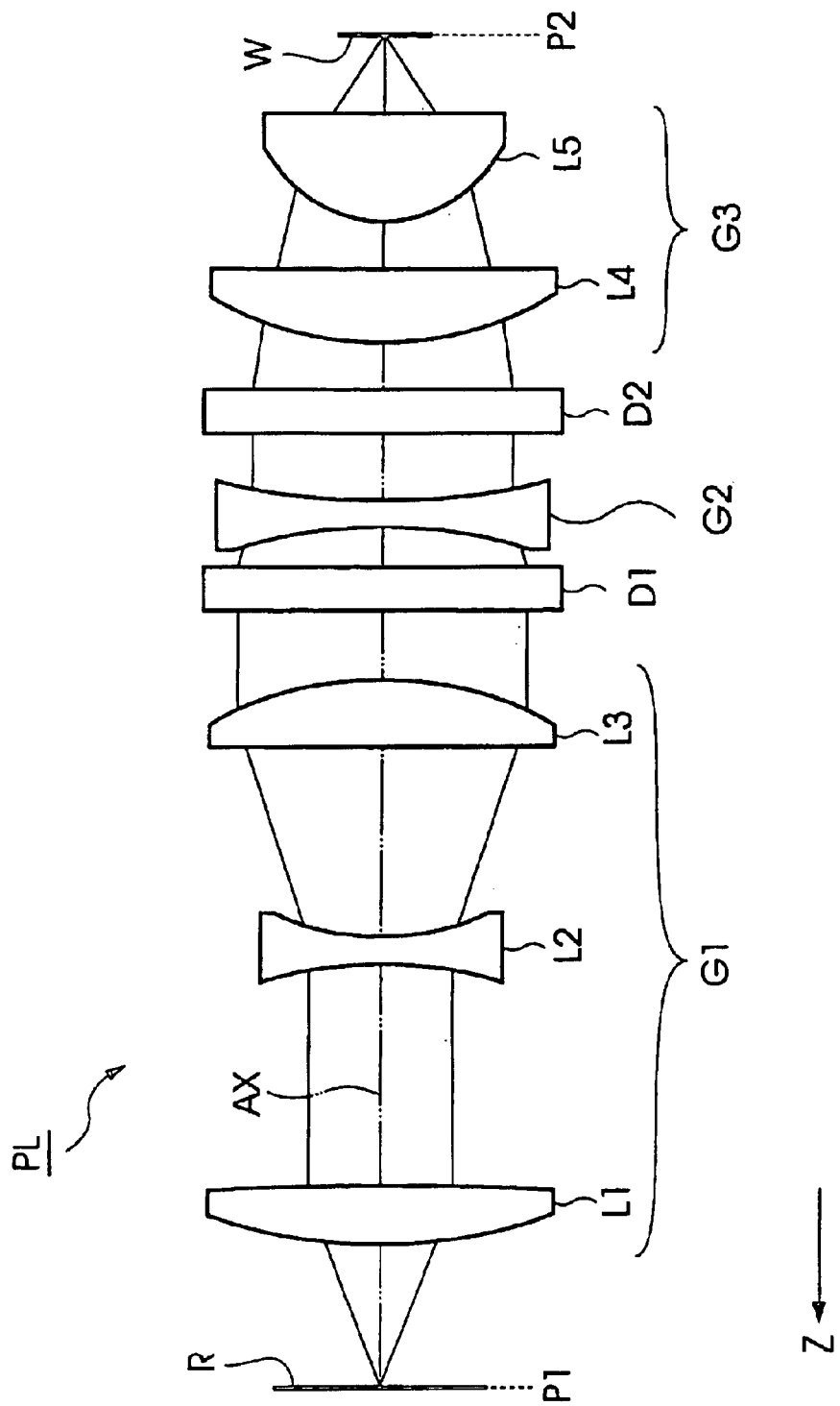
FIG. 2 is a cross-sectional view of a lens, showing a basic optical construction of the projection optical system according to one embodiment of the present invention.

FIG. 2 is a cross-sectional view of a lens showing a basic optical construction of a projection optical system according to one embodiment of the present invention. In FIG. 2, the basic construction of the projection optical system PL is such that there are arranged, in order from a reticle R set on the first plane (object surface) P1, an optical system G1, a diffractive optical element D1, an optical system G2, a diffractive optical element D2, and an optical system G3. The projection optical system PL is telecentric both on the reticle R (object surface) side, and on the wafer W (image surface) side arranged on the second plane (image surface).

The optical system G1 comprises, in order from the first plane P1, a double-convex positive lens L1, a double-concave lens L2, and a plano-convex lens L3 with the convex surface facing the second plane P2, and is designed so as to have a positive power as a whole. This optical system G1 converts an axial luminous flux on the first plane P1 to substantially a parallel luminous flux, and guides this parallel luminous flux to the diffractive optical element D1, and constitutes a front optical system referred to in the present invention. Here, the reason why the axial luminous flux on the first plane P1 is converted to substantially a parallel luminous flux is described hereunder. In the diffractive optical element D1, the diffraction efficiency changes depending on the angle of incidence of the incident light. Hence if a luminous flux such as divergent luminous flux or convergent luminous flux is shone thereon, the image quality is degraded. Therefore, this is to prevent degradation of the image quality of the diffractive optical element D1, by reducing a variation in the angle of incidence of the incident luminous flux as much as possible.

As described above, when a wavelength of light emitted from the light source 10 is about 200 μm, or when a wavelength shorter than 200 μm is used, the glass material for the lenses L1 to L3 constituting the optical system G1 or the lenses constituting the optical system G3 is restricted. Particularly, when an $F_2$ excimer laser (emission wavelength: 157.624 nm) is used for the light source 10, all of the lenses L1 to L3 constituting the optical system G1 are formed of fluorite.

The diffractive optical element D1 is provided for correcting chromatic aberration. Here, the reason for correcting chromatic aberration by using the diffractive optical element D1 is because the light emitted from the light source 10 in FIG. 1 is light having a short wavelength of about 200 μm, and hence the glass material of lenses that can be arranged on the optical path is restricted. That is to say, when the projection optical system PL is constituted of a single glass material, insufficient correction of chromatic aberration by means of a positive lens occurs. Hence chromatic aberration due to the lenses is corrected, by using a diffractive optical element having a chromatic aberration characteristic opposite to that of the normal lenses, as the diffractive optical element D1. Here, the chromatic aberration characteristic which a normal lens has is an aberration characteristic attributable to a characteristic where dispersion increases as the wavelength becomes short. The diffractive optical element D1 is designed so as to have a positive power in order to correct chromatic aberration of a positive lens.

The optical system G2 is an optical system having a negative power referred to in the present invention, and is provided for converting the axial luminous flux on the first plane P1 diffracted by the diffractive optical element D1 to substantially a parallel luminous flux and guiding the parallel luminous flux to the diffractive optical element D2. Here, the axial luminous flux on the first plane P1 diffracted by the diffractive optical element D1 is converted again to a substantially parallel luminous flux by the optical system G2, for the same reason as in the above described optical system D1. That is to say, in the diffractive optical element D2, the diffraction efficiency changes depending on the angle of incidence of the incident light. Hence if a luminous flux diffracted by the diffractive optical element D1 is directly shone thereon, the image quality of the diffractive optical element D2 is degraded. Therefore, degradation in the image quality of the diffractive optical element D2 is prevented, by reducing variations in the incident luminous flux as much as possible, by converting the luminous flux incident on the diffractive optical element D2 into a parallel luminous flux.

Here, the reason why two diffractive optical elements, namely the diffractive optical element D1 and the diffractive optical element D2, are provided is as follows. That is to say, the diffractive optical element D1 and the diffractive optical element D2 are provided for correcting chromatic aberration due to the lenses arranged on the optical path, as described above, and in order to correct this chromatic aberration, a power higher than a certain level is required. Therefore, if for example, an attempt is made to obtain a power which can correct chromatic aberration of lenses with only a single diffractive optical element D1, by omitting the diffractive optical element D2 and the optical system G2, the lattice spacing (pitch) of the diffractive optical element D1 becomes quite narrow, since the wavelength of light emitted from the light source 10 is 200 μm or less. Actually, however, it is difficult to manufacture a diffractive optical element having a pitch of 1 μm or less. Therefore, by arranging two diffractive optical elements, that is, the diffractive optical element D1 and the diffractive optical element D2 shown in FIG. 2, on the optical path, the power required for correction of chromatic aberration is obtained.

As described above, a projection optical system having sufficient chromatic aberration correcting ability, but without having degradation in the image quality due to the angular characteristic can be realized, by arranging a plurality of diffractive optical elements D1 and diffractive optical elements D2 in the optical path and arranging the optical system G1 in the optical path in the previous stage of the diffractive optical element D1, as well as arranging the optical system G2 having a negative power between the diffractive optical element D1 and the diffractive optical element D2, to thereby allow a parallel luminous flux to enter with respect to the diffractive optical element D1 and the diffractive optical element D2. In FIG. 2, there is shown, for the optical system G2, a refractive optical system, for example, a double-concave lens as an example. However, the optical system G2 need only have a negative refractive index, and for example, it may be a reflecting optical system such as a convex reflecting mirror or the like.

The optical system G3 comprises, in order from the first plane P1, a double-convex positive lens L4, and a plano-convex lens L5 with the convex surface facing the first plane P1, and is designed so as to have a positive power as a whole. This optical system G3 is for image formation on the second plane P2, that is, the wafer W, by the light diffracted by the diffractive optical element D2, and has a positive power and constitutes a rear optical system referred to in the present invention. As described above, when a wavelength of light emitted from the light source 10 is about 200 μm, or when a wavelength shorter than 200 μm is used, the glass material for the lens L4 and lens L5 constituting the optical system G3 is restricted. Particularly, when an $F_2$ excimer laser (emission wavelength: 157.624 nm) is used for the light source 10, all of the lens L4 and lens L5 constituting the optical system G3 are formed of fluorite.

In order to make the resolution of the exposure apparatus 0.1 μm or less, it is essential to use light having a wavelength shorter than 180 μm as the wavelength of light emitted from the light source 10. However, by using fluorite for the material of all lenses constituting the projection optical system PL, absorption of light due to the lenses decreases, and the wafer W can be exposed by illumination light having high light intensity, thereby enabling realization of a high throughput. For the substrate of the diffractive optical elements D1 and D2, any material having an internal transmittance of 70% or higher may be used, by making the thickness sufficiently thin.

Here, when a numerical aperture on the second plane P2 side of the projection optical system PL shown in FIG. 2 is designated as NA, the imaging magnification of the optical system G1 is designated as β, the focal length of the diffractive optical element D1 and the diffractive optical element D2 with respect to the wavelength of light emitted from the light source 10 is designated as f, and the distance from the first plane P1 to the second plane P2 is designated as L, it is desirable to satisfy the following expression (1) and expression (2):

$$1/|NA\cdot\beta|<0.7 \quad (1)$$

$$0.38<f/L<1.2 \quad (2)$$

The above expression (1) is an expression representing conditions for realizing a projection optical system PL having a large numerical aperture, but without having degradation in the image quality due to the angular characteristic. In the expression (1), it is more desirable that the value of $1/|NA\cdot\beta|$ is smaller than 0.55. Moreover, the above expression (2) is an expression representing conditions for realizing sufficient correction of chromatic aberration by means of the diffractive optical element D1 and the diffractive optical element D2. In the expression (2), if the value of f/L becomes equal to or below a value of the lower limit 0.38, diffractive optical elements D1 and D2 having a quite narrow pitch must be manufactured, thereby making it difficult to manufacture the diffractive optical elements D1 and D2. As described above, the lower limit in the expression (2) is a value determined by the ease of production of the diffractive optical elements D1 and D2. Moreover, the upper limit in the expression (2) is an expression representing conditions for obtaining a sufficient power for correcting chromatic aberration of the projection optical system PL, and if the value of f/L becomes equal to or higher than the value of the upper limit 1.2, sufficient correction of chromatic aberration cannot be performed. Also in the expression (2), taking the ease of production of the diffractive optical elements and the degree of chromatic aberration correction into consideration, it is further desired that the value of f/L be smaller than 0.42 and larger than 1.0. Furthermore, when higher-order diffracted light is used as the imaging light, or when the numerical aperture NA exceeds 0.7, it is desirable that all the diffractive optical elements arranged in the projection optical system PL satisfy the above expressions (1) and (2).

Next, the structure of the diffractive optical elements D1 and D2 will be described.

Figure 3A:
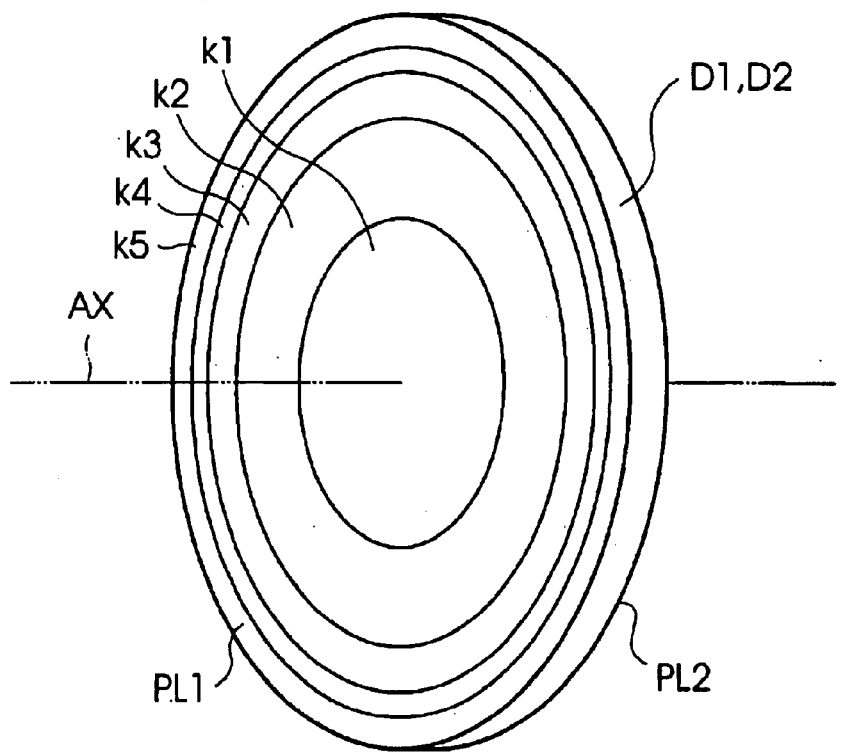
FIG. 3A is a perspective view schematically showing one embodiment of the construction of a diffractive optical element.
Figure 3B:
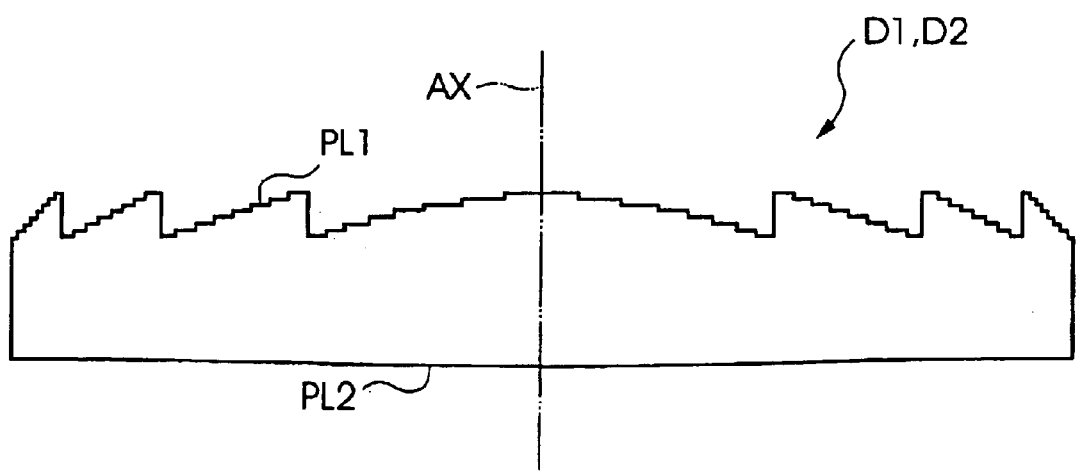
FIG. 3B is a cross-sectional view schematically showing one embodiment of the construction of a diffractive optical element.

At first, one embodiment of the structure of the diffractive optical elements D1 and D2 will be described. FIGS. 3A and 3B are diagrams schematically showing one embodiment of the structure of the diffractive optical elements D1 and D2, with FIG. 3A being a perspective view and FIG. 3B being a cross-sectional view. As shown in FIGS. 3A and 3B, at least one of the diffractive optical elements D1 and D2 has, other than a diffraction pattern surface PL1 having a diffraction pattern formed thereon, a correction surface PL2 for correcting any manufacturing error on the diffraction pattern surface PL1. On the diffraction pattern surface PL1, there are formed a plurality of ring areas k1 to k5 having a positive power, in concentric circles centered on the optical axis AX, with a binary optical element formed in each ring area k1 to k5. As shown in FIG. 3B, the binary optical element formed in each ring area k1 to k5 is obtained by forming the surface of a Fresnel ring-plate in a stepped form, and it is normally formed for increasing the diffraction efficiency of the ring plate.

Figure 4:
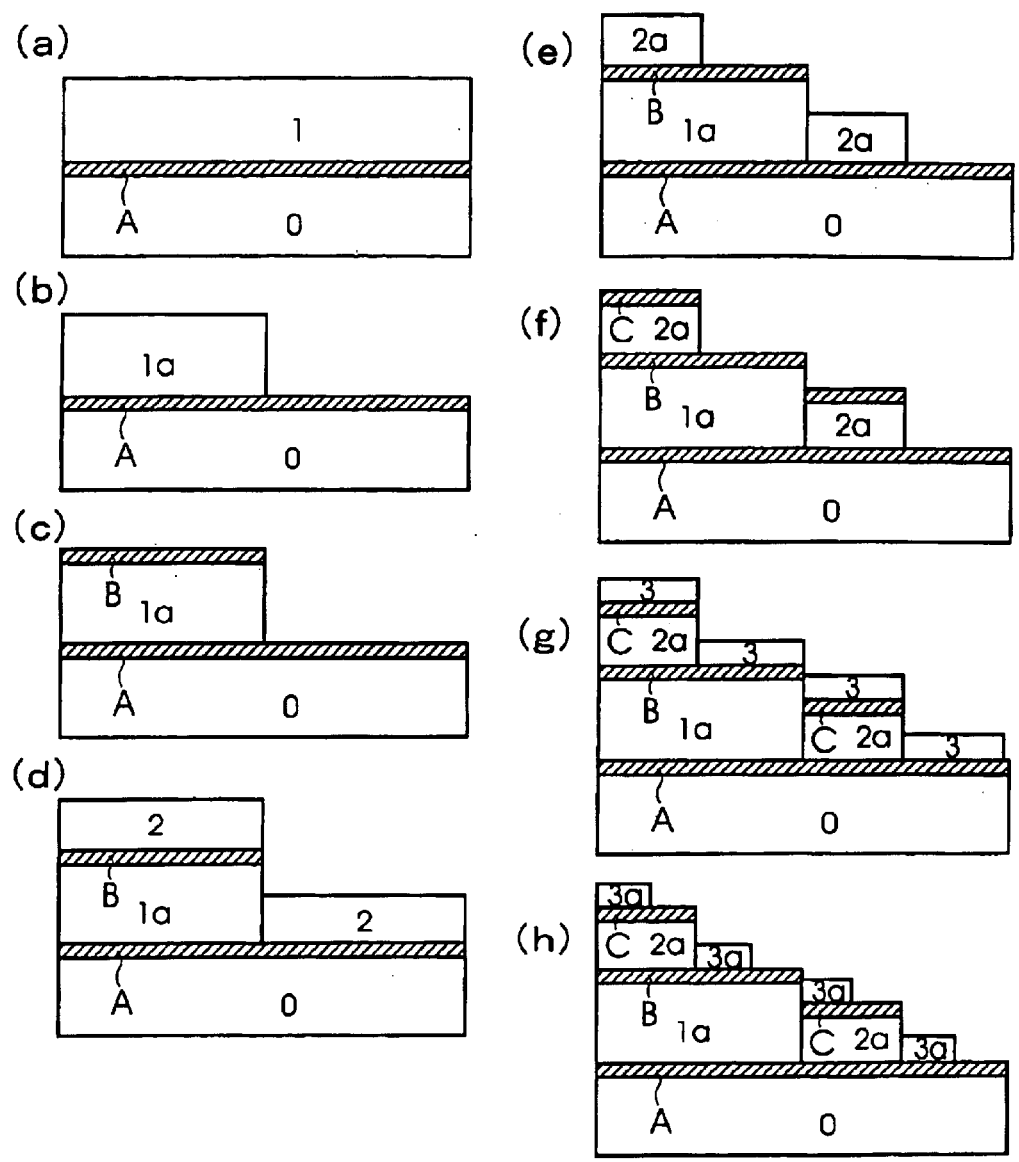
FIG. 4 is a diagram for explaining one example of a method of forming a binary optical element.

Here, a method of forming the binary optical element will be briefly described. FIG. 4 is a diagram for explaining one example of a method of forming the binary optical element. At first, as shown in step (a) in FIG. 4, a first etching stopper layer "A" is provided on a flat substrate "0", a first transparent layer "1" comprising a $SiO_2$ film is formed by deposition, and further, a Cr film formed in, for example, 50 nm is prepared on the first transparent layer "1" continuously by an electron-beam evaporation technique. This becomes a substrate to be processed. Next, a photoresist is applied on the substrate having the first etching stopper layer "A" and the Cr film formed on the first transparent layer "1" by an application method such as spin coating, and the photoresist is subjected to baking to form a resist layer having a thickness of about 0.5 $\mu$m. Subsequently, such a substrate is carried into an exposure apparatus or the like for performing rotating exposure, and a pattern image on a reticle formed thereon, having a pattern corresponding to a two-stage structure, of for example an eight-stage layered structure, is transferred onto the substrate depending on the binary optical element to be designed.

When transfer of various patterns has been completed, the substrate having a first resist pattern formed thereon is placed in a reactive ion etching apparatus, to etch the Cr according to the first resist pattern, and to remove the resist provided on the substrate W, after the Cr etching. Due to the above operation, the resist pattern is transferred to the Cr film. Subsequently, this Cr pattern is masked, to etch the first transparent layer "1" being in contact with the air surface. After etching, the Cr being a mask is removed, and through a pure water rinse and drying step, a first transparent pattern "1a" is formed, with the first etching stopper layer "A" exposed (see step (b) in FIG. 4). An $Al_2O_3$ film is then deposited only on the upper part of the first transparent pattern "1a", formed in this manner, to form a second etching stopper layer "B" (step (c) in FIG. 4). In this case, for example, by a method in which a resist is applied on the exposed first stopper layer "A", and $Al_2O_3$ on the resist is the removed together with the resist, the second etching stopper layer "B" is formed only on the upper part of the first transparent pattern "1a". As a result, a pattern having a two-stage layered structure is formed.

Moreover, by a similar method to the one shown in step (a) in FIG. 4, a second transparent layer "2" is formed on the surfaces of the exposed first stopper layer "A" and the second stopper layer "B" (see step (d) in FIG. 4). Then, continuously, a Cr film is formed on the second transparent layer "2", and a resist is applied by spin coating on this Cr film, and the resist is subjected to baking, to form a resist layer having a thickness of about 0.5 $\mu$m. Subsequently, processing for exposing the resist on the second transparent layer "2" is performed, using a reticle having a pattern corresponding to the four-stage structure, of the eight-stage layered structure, depending on the pattern to be formed. This second resist pattern is used as a mask to etch the Cr film on the second transparent layer "2" to transfer the pattern, and thereafter the second resist pattern is removed. Then, this Cr pattern is used as a mask to perform reactive ion etching of the second transparent layer "2" under the same conditions as those of the etching step of the first transparent layer "1", to thereby form a second transparent layer pattern 2a (see step (e) in FIG. 4).

Next, an $Al_2O_3$ film is deposited only on the upper part of the second transparent pattern 2a, to form a third etching stopper layer C (see step (f) in FIG. 4). At this point of time, a pattern of the four-stage layered structure has been formed. Further, a pattern of an eight-stage layered structure is formed, by repeating the same steps until the above four-stage layered structure is formed. That is to say, a third transparent layer 3 is formed over the exposed whole surface of the first stopper layer "A", the second stopper layer "B" and the third stopper layer "C" (see step (g) in FIG. 4). After the Cr film and the resist layer have been formed on these third transparent layers 3, the pattern image is exposed on the resist layer, using the reticle pattern corresponding to the diffraction pattern of the eight-stage layered structure, and then transferred to the Cr film sequentially. Using the Cr pattern formed in this manner as a mask, reactive ion etching is performed on the third transparent layer 3, to thereby form a third transparent layer pattern 3a (see step (h) in FIG. 4).

Through the above steps, a diffractive optical element having the binary optical element shown in FIG. 3B formed thereon can be obtained. As described above, the diffraction pattern of the diffractive optical elements D1 and D2 are formed on a flat substrate. If the diffraction pattern surfaces of the diffractive optical elements D1 and D2 are formed on the flat substrate, a lithography process using an exposure apparatus becomes possible, enabling production of a diffractive optical element comprising a finer pattern. Moreover, by making a binary optical element in which the ring areas k1 to k5 are formed in concentric circles, centered on the optical axis AX, with each ring approximated in a stepped form by means of a plurality of surfaces, the manufacturing process can be simplified, and high-precision patterns can be produced.

The number of stages of the binary optical elements formed in the ring areas of the diffractive optical elements D1 and D2 shown in FIG. 3B are formed the same (for example, eight stages). However, since the ring areas in the vicinity of the periphery of the diffractive optical elements D1 and D2 have a narrow pitch, in many cases, it becomes more difficult to manufacture these stages, compared to the production of the stages of the binary optical element formed in the paraxial area with respect to the optical axis AX. In such a case, the number of stages of the binary optical element formed in the ring areas in the vicinity of the periphery of the diffractive optical elements D1 and D2 may be reduced. For example, by changing the number of stages of the steps which form each ring depending on the area, such that the vicinity of the periphery having a narrow pitch (for example, the ring areas k4, K5 in FIG. 3A) has four stages, the central part largely affected by the unnecessary diffracted light (for example, the ring area k1 in FIG. 3A) has 16 stages, and the middle part (for example, the ring areas k2, k3 in FIG. 3A) has 8 stages, a diffractive optical element which is minimally affected by the unnecessary diffracted light can be obtained, in a manufacturable pattern and with higher diffraction efficiency as a whole. Moreover, the number of stages of the binary optical element is not always such that there are many stages formed in the ring areas in the vicinity of the optical axis AX, and a few stages formed in the ring areas in the vicinity of the periphery of the diffractive optical elements D1 and D2, and the number of stages of the binary optical element can be appropriately set according to the required diffraction performance.

Furthermore, the number of stages in each ring area formed in the diffractive optical elements D1 and D2 is changed not only to facilitate the production of the diffractive optical elements D1 and D2, but also to decrease flare light reaching the wafer W. Here, the flare light stands for the unnecessary order of light diffracted by the diffractive optical elements D1 and D2. In order to form an image of a pattern formed on the reticle R on the wafer W with high precision, it is desired to reduce the flare light as much as possible. Here, of the flare light caused in the projection optical system PL, much of the flare light passing through the paraxial area of the optical axis AX reaches the wafer W, and the flare light passing through the far-axial area has a low rate of proceeding to out of the lens and reaching the wafer W. Therefore, in the paraxial area, the pitch of the diffractive optical elements D1 and D2 is designed to be narrow so as to suppress the occurrence of the unnecessary flare light and to increase the diffraction efficiency to the necessary order, and in the far-axial area, the pitch is designed to be wide, since even if the rate of occurrence of the flare light is relatively high, the rate of flare light reaching the wafer W is low.

As described above, when the number of stages of the binary optical element formed in each ring area is changed, since the intensity distribution of the image-forming light is changed step-wise in the boundary where the number of stages is changed, degradation in the image quality may occur. That is to say, for example, if the number of stages decreases in the vicinity of the periphery of the diffractive optical elements D1 and D2, deviation from the Fresnel ring-plate increases, and hence the diffraction efficiency decreases. In this case, by arranging a filter having a transmittance set depending on each ring area, in the vicinity of the diffractive optical elements D1 and D2, the intensity distribution of the diffracted light can be made uniform, and as a result, degradation in the image quality can be prevented.

The correction surface PL2 formed on the diffractive optical elements D1 and D2 will now be described. The correction surface PL2 is for correcting wave front aberration due to any manufacturing error of the diffraction pattern surface PL1 of the diffractive optical elements D1 and D2. A slightly aspheric surface having a sag amount of 0.5 $\mu$m or less from a predetermined reference plane, such as a flat surface or a spherical surface is formed thereon. The surface shape of this slightly aspheric surface can be measured by an interferometer for measuring a spherical surface or a flat surface, for example, Fizeau interferometer. Hence a slightly aspheric surface having a highly precise shape can be formed.

Figure 5A:
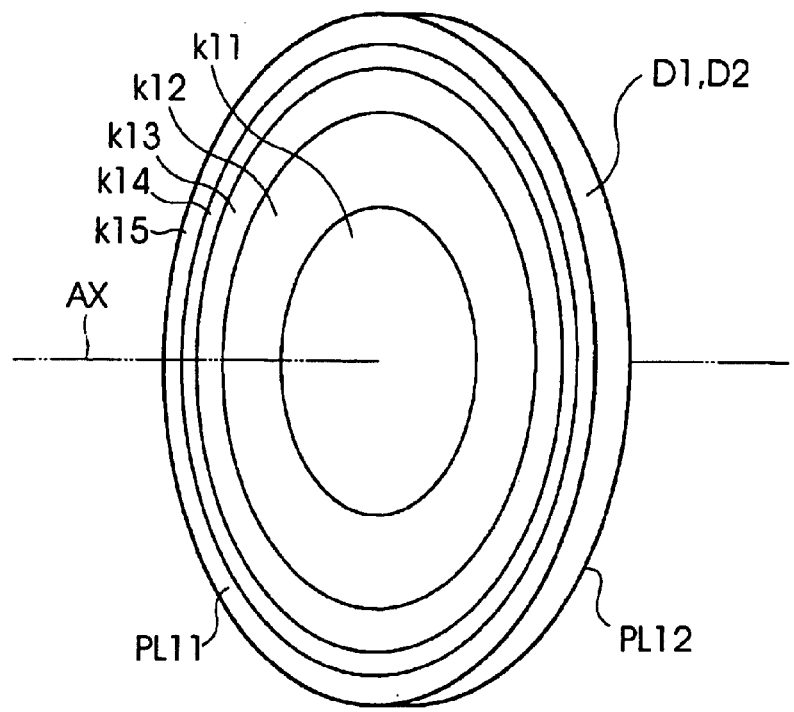
FIG. 5A is a perspective view schematically showing an other embodiment of the construction of the diffractive optical element.
Figure 5B:
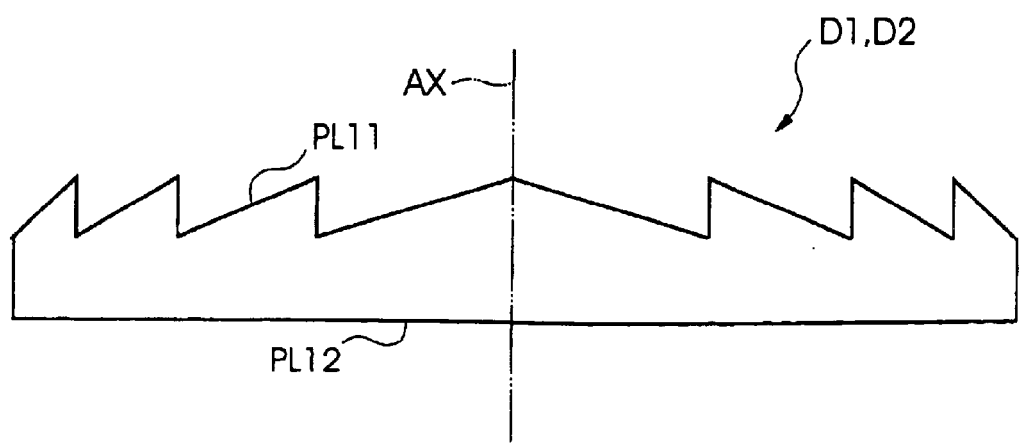
FIG. 5B is a cross-sectional view schematically showing an other embodiment of the construction of the diffractive optical element.

An other embodiment of the structure of the diffractive optical elements D1 and D2 will now be described. FIGS. 5A and 5B are diagrams schematically showing an other embodiment of the construction of the diffractive optical elements D1 and D2, with FIG. 5A being a perspective view and FIG. 5B being a cross-sectional view. As shown in FIGS. 5A and 5B, the diffractive optical elements D1 and D2 have a diffraction pattern surface PL11 formed in rings of concentric circles centered on an optical axis AX, and having a cross-section in a sawtooth shape. Also, there may be formed a correction surface PL12 similar to the correction surface PL2 of the diffractive optical elements D1 and D2 shown in FIGS. 3A and 3B. As shown in FIGS. 5A and 5B, the diffraction pattern of the sawtooth shape formed in rings in each ring area is formed so that each ring satisfies a certain predetermined diffraction efficiency, with respect to diffracted light of an optional order.

Moreover, in the case where the cross-section of the diffractive optical elements D1 and D2 is made sawtooth shape, if it is assumed that an area from the optical axis AX to a position a predetermined distance away therefrom is a first ring area, and the ring areas outside thereof are a second ring area and a third ring area, and so on, it is desired so that the first ring area have a sawtooth cross-section so that the diffraction efficiency increases most with the 1st or −1st diffracted light, and the ring areas outside thereof have a sawtooth cross-section so that the diffraction efficiency increases most with the mth or −mth diffracted light (m is an integer satisfying m>2), taking ease of production into account. By setting in this manner, even if the minimum pitch of each ring is not decreased, the power of the diffractive optical elements D1 and D2 can be set high. When diffracted light of a higher order is used according to the above construction, the angular characteristic becomes more disadvantageous. In this embodiment, however, since parallel light is shone onto the diffractive optical element D1 by means of the optical system G1 and parallel light is shone onto the diffractive optical element D2 by means of the optical system G2, the difference in the angle of incidence of the luminous flux shone onto the diffractive optical elements D1 and D2 becomes quite small, causing no big problem.

Moreover, in order to correct the axial chromatic aberration of the projection optical system PL, it is necessary to increase the power of the diffractive optical elements D1 and D2 to a desired order. However, if an attempt is made to manufacture diffractive optical elements D1 and D2 having a large power, the pitch around the diffractive optical elements D1 and D2 becomes too small. Therefore, if the pitch is arranged so that the power decreases gradually from the central position of the diffractive optical elements D1 and D2 toward the periphery thereof, it is possible to prevent the pitch in the peripheral portion becoming too small, while correcting the axial chromatic aberration. However, such a pitch arrangement corrects the spherical aberration too much. Therefore, at least two diffractive optical elements, namely diffractive optical element D1 and diffractive optical element D2 are arranged in the projection optical system PL, and an aspherical lens is arranged such that at least one spherical aberration is not corrected excessively, in the optical path between the diffractive optical element D1 and the diffractive optical element D2, or one surface of the optical system G3 is made aspherical, thereby realizing a projection optical system in which aberration is favorably corrected. In the case of this embodiment described above, the correction surface PL2 or the correction surface PL12 is provided on one of the diffractive optical elements D1 and D2 for the purpose of correcting any manufacturing error of the diffraction pattern surface PL1 or the diffraction pattern surface PL11 of the diffractive optical elements D1 and D2. However, this technical idea is not limited to diffractive optical elements, and can be applied to general optical elements.

Figure 6:
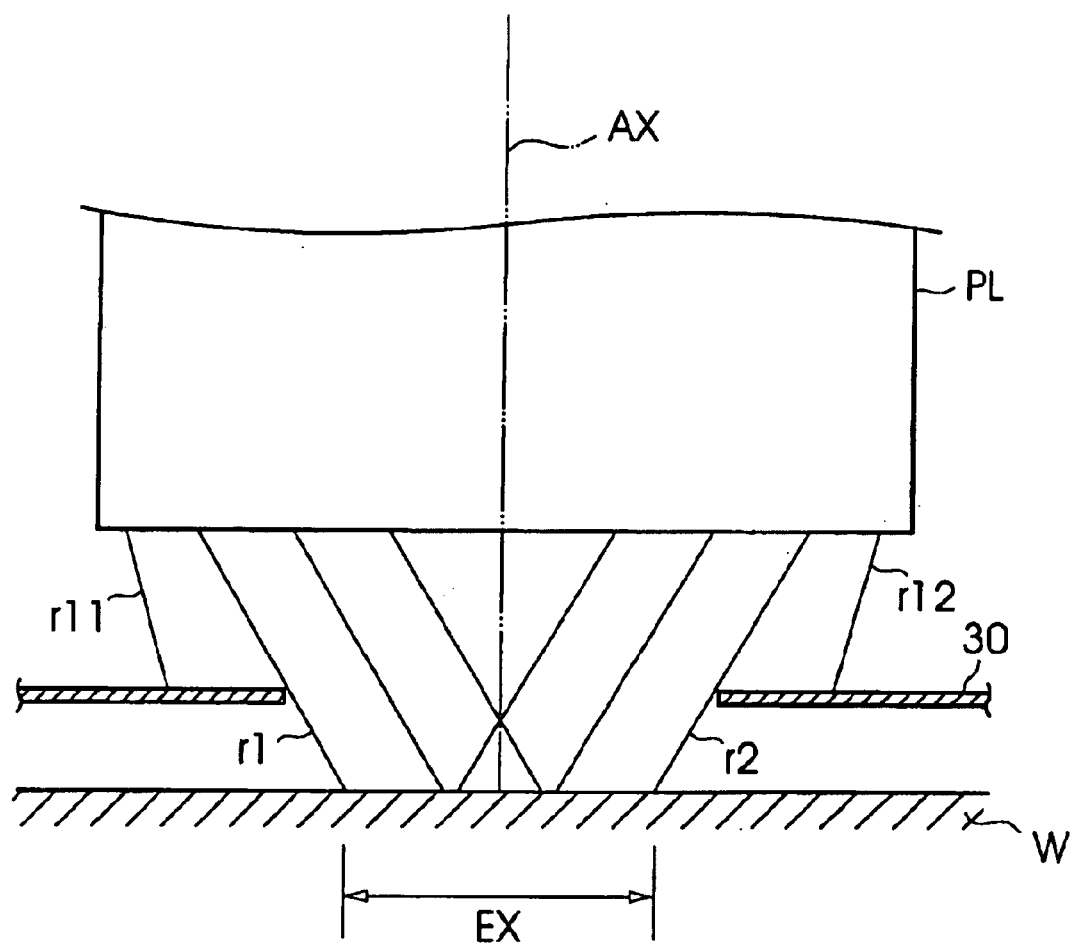
FIG. 6 is a diagram showing a situation where illumination light via a projection optical system is irradiated onto a wafer.

Next, the situation where the illumination light is irradiated onto the wafer W via the projection optical system PL described above will be described. FIG. 6 is a diagram showing the situation where the illumination light is irradiated onto a wafer via the projection optical system PL. In FIG. 6, of the illumination light emitted from the projection optical system PL and irradiated onto the wafer W, in view of the design, the illumination light irradiated onto the illumination area EX is the illumination light between the luminous flux denoted by a reference symbol r1 and the luminous flux denoted by a reference symbol r2 in the figure. However, since the diffractive optical elements D1 and D2 are used, flare light occurs. The flare light mainly appears in the vicinity of the luminous flux denoted by the reference symbols r11, r12 in the figure. Therefore, in order to prevent this flare light from being irradiated onto the wafer W, it is desirable to provide a field stop 30 between the projection optical system PL and the wafer W.

Next, an embodiment of the projection optical system PL of the present invention will be described.

Figure 7:
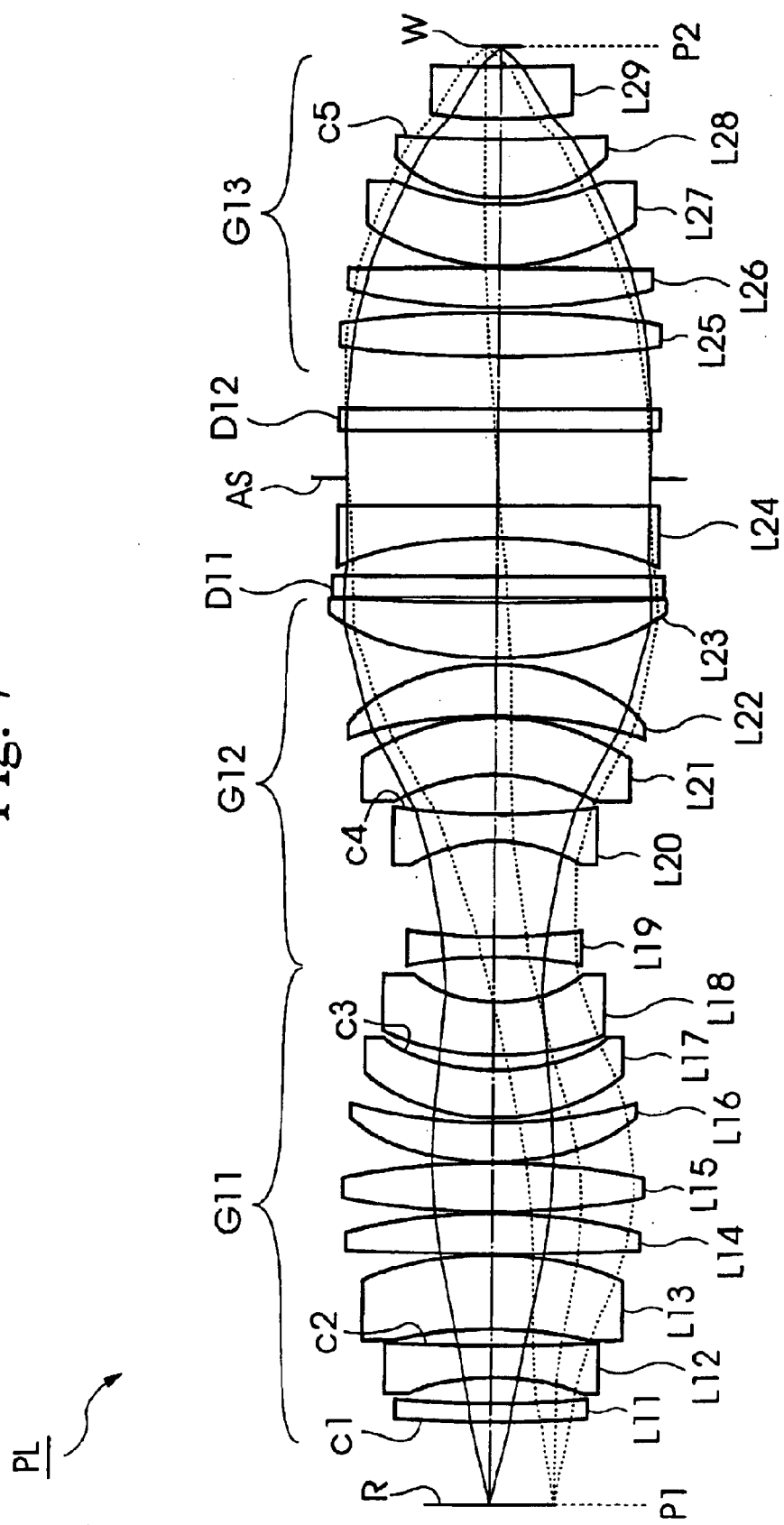
FIG. 7 is a cross-sectional view of a lens showing the optical construction of the projection optical system according to one embodiment of the present invention.

FIG. 7 is a cross-sectional view of a lens showing the optical construction of the projection optical system PL according to one embodiment of the present invention. The wavelength λ in this embodiment is 157.6244 nm. In FIG. 7, the projection optical system PL is constituted by arranging, in order from a reticle R (object surface) side arranged on the first plane P1, a first lens group G11 having a positive refracting power, a second lens group G12 having a negative refracting power, a diffractive optical element D11 having a positive power, a negative meniscus lens L24 having a negative refracting power, with the concave surface facing the first plane P1, a diffractive optical element D12 having a positive power, and a third lens group G13 having a positive refracting power. This projection optical system is telecentric both on the reticle R (object surface) side, and on the wafer W (image surface) side arranged on the second plane P2. The first lens group G11 and the second lens group G12 correspond to the optical system G1 in FIG. 2, the diffractive optical element D11 and the diffractive optical element D12 correspond to the diffractive optical element D1 and the diffractive optical element D2 in FIG. 2, respectively, the negative meniscus lens L24 corresponds to the optical system G2 in FIG. 2, and the third lens group 13 corresponds to the optical system G3 in FIG. 1.

The first lens group G11 comprises eight lenses arranged therein, in order from the first plane P1 side namely; a negative meniscus lens L11 with the concave surface facing the second plane P2, a double-concave lens L12, a positive meniscus lens L13 with the convex surface facing the second plane P2 side, a double-convex lens L14, a double-convex lens L15, a positive meniscus lens L16 with the convex surface facing the first plane P1 side, a negative meniscus lens L17 with the concave surface facing the second plane P2 side, and a negative meniscus lens L18 with the concave surface facing the second plane P2 side. Here, the surface c1 of the negative meniscus lens L11 on the first plane P1 side, the surface c2 of the double-concave lens L12 on the second plane P2 side, and the surface c3 of the negative meniscus lens L17 on the second plane P2 side are formed aspheric.

The second lens group G12 comprises five lenses arranged therein, in order from the first plane P1 side namely; a double-concave lens L19, a double-concave lens L20, a negative meniscus lens L21 with the concave surface facing the first plane P1 side, a positive meniscus lens L22 with the convex surface facing the second plane P2 side, and a positive meniscus lens L23 with the convex surface facing the first plane P1 side. Here, the surface c4 of the double-concave lens L20 on the second plane P2 side is formed aspheric. The diffractive optical element D11 and the diffractive optical element D12 are designed so as to have a different diffraction characteristics depending on the position thereof. Therefore, in this embodiment, the diffractive optical element D11 and the diffractive optical element D12 are handled as with aspheric surface lenses, to perform aberration calculation. Between the negative meniscus lens L24 and the diffractive optical element D12, there is arranged a variable aperture stop AS for determining the numerical aperture (NA) of the projection optical system PL.

The third lens group G13 comprises five lenses arranged therein, in order from the first plane P1 side namely; a double-convex lens L25, a positive meniscus lens L26 with the convex surface facing the first plane P1 side, a positive meniscus lens L27 with the convex surface facing the first plane P1 side, a positive meniscus lens L28 with the convex surface facing the first plane P1 side, and a positive meniscus lens L29 with the convex surface facing the first plane P1 side. Here, the surface c5 of the positive meniscus lens L28 on the second plane P2 side is formed aspheric.

Parameter values of the projection optical system PL according to the one embodiment of the present invention are shown below. Here, the surface c1 of the negative meniscus lens L11 on the first plane P1 side, the surface c2 of the double-concave lens L12 on the second plane P2 side, the surface c3 of the negative meniscus lens L17 on the second plane P2 side, the surface c4 of the double-concave lens L20 on the second plane P2 side and the surface c5 of the positive meniscus lens L28 on the second plane P2 side, in the projection optical system PL, are formed aspheric, respectively, and these surfaces are expressed by the following expression (3).

$$Z = \frac{\rho \cdot Y^2}{1 + \sqrt{(1-(1+\kappa) \cdot \rho^2 \cdot Y^2)}} + (A) \cdot Y^4 + (B) \cdot Y^6 + (C) \cdot Y^8 + (D) \cdot Y^{10} + (E) \cdot Y^{12} + (F) \cdot Y^{14} + (G) \cdot Y^{16} + (H) \cdot Y^{18} + (J) \cdot Y^{20} \quad (3)$$

wherein, in the above expression (3),
z: deviation from a tangent plane being in contact with the lens on the optical axis (sag amount);
ρ: curvature;
Y: distance from the optical axis;
k: conic projection;
A: quartic aspherical coefficient;
B: sixth order aspherical coefficient;
C: eighth order aspherical coefficient;
D: tenth order aspherical coefficient;
E: twelfth order aspherical coefficient;
F: fourteenth order aspherical coefficient;
G: sixteenth order aspherical coefficient;
H: eighteenth order aspherical coefficient;
J: twentieth order aspherical coefficient.

Moreover, the diffractive optical element D11 and the diffractive optical element D12 are designed by an ultra-high index method designating a virtual refractive index as 1001.

Table 1 shown below is a table showing parameter values of the projection optical system PL according to the one embodiment of the present invention. The unit of numerical values shown in Table 1 is millimeters, and is rounded to three places after the decimal point. The distance from the position on the first plane P1 to the surface c1 of the negative meniscus lens L11 on the first plane P1 side in FIG. 7 is set to be 55 mm, the distance from the surface of the positive meniscus lens L29 on the second plane P2 side to the second plane P2 is set to be 13.196 mm, and the distance from the first plane P1 to the second plane P2 is set to be 986 mm. Meanwhile, the focal length of the diffractive optical element D11 is 509.8 mm, and the focal length of the diffractive optical element D12 is 702.9 mm. Moreover, the value of 1/|NA·β| shown in the above described expression (1) is 0.122, and the value of f/L shown in the above described expression (2) is 0.517.

The glass material of each lens is fluorite, and the refractive index of fluorite in the used wavelength is 1.559, and the dispersion (dn/dλ) is −2.605E-6/pm. Also, in Table 1, fluorite is mentioned as the substrate of the diffractive optical elements D11 and D12, but this substrate is not limited to fluorite, and for example, quartz or quartz having no hydroxyl group mixed therein, may be used.

However, in Table 1, the numerical aperture of the projection optical system PL on the second plane P2 side is 0.75, with the magnification being ¼, the field image being φ 23 m, and the field of view being a rectangular shape of 22×6 mm. Moreover, in Table 1, the leftmost figure is the order of the lens surface from the first plane P1 side, r denotes a radius of curvature of the lens surface, and d denotes a space from a lens surface to the next lens surface. Also, in Table 1, in order to facilitate the arrangement of each lens, glass materials from one lens surface to the next lens surface are shown.

TABLE 1

| Surface Number | r | d | Glass Material |
| --- | --- | --- | --- |
| 1: (asphere) | 3898.447 | 13.306 | fluorite |
| 2: | 486.711 | 16.403 | |
| 3: | −168.587 | 23.207 | fluorite |
| 4: (asphere) | 2227.726 | 10.443 | |
| 5: | −327.045 | 49.709 | fluorite |
| 6: | −215.624 | 1.000 | |
| 7: | 1696.173 | 28.030 | fluorite |
| 8: | −325.178 | 1.000 | |
| 9: | 521.134 | 32.820 | fluorite |
| 10: | −419.204 | 1.000 | |
| 11: | 171.992 | 25.652 | fluorite |
| 12: | 330.412 | 4.280 | |
| 13: | 139.024 | 32.100 | fluorite |
| 14: (asphere) | 128.269 | 10.277 | |
| 15: | 183.435 | 36.732 | fluorite |
| 16: | 102.175 | 30.874 | |
| 17: | −260.834 | 13.139 | fluorite |
| 18: | 420.621 | 67.092 | |
| 19: | −97.580 | 16.089 | fluorite |
| 20: (asphere) | 463.064 | 26.354 | |
| 21: | −136.183 | 39.289 | fluorite |
| 22: | −154.619 | 1.000 | |
| 23: | −305.514 | 34.294 | fluorite |
| 24 | −143.368 | 4.468 | |
| 25: | 229.134 | 37.386 | fluorite |
| 26: | 2869.502 | 3.441 | |
| 27: | ∞ | 15.000 | fluorite (substrate of D11) |
| 28: | ∞ | 0.000 | |
| 29: (asphere) | −509824.084 | 25.911 | (diffractive optical element D11) |
| 30: | −312.844 | 20.257 | fluorite |
| 31: | −174441.248 | 20.000 | |
| 32: | ∞ | 32.069 | (opening AS) |
| 33: | ∞ | 15.000 | fluorite (substrate of D12) |
| 34 | ∞ | 0.000 | |
| 35: (asphere) | −702884.42 | 34.402 | (diffractive optical element D12) |
| 36: | 692.885 | 30.706 | fluorite |
| 37: | −744.752 | 2.453 | |
| 38: | 418.127 | 27.577 | fluorite |
| 39: | 40398.612 | 1.538 | |
| 40: | 155.116 | 40.970 | fluorite |
| 41: | 167.602 | 4.018 | |
| 42: | 108.981 | 38.699 | fluorite |
| 43: (asphere) | 789.046 | 14.481 | |
| 44 | 361.204 | 35.201 | fluorite |
| 45: | 1755.193 | | |

Moreover, of each lens surface shown in the above Table 1, the aspherical coefficients related to the aspherical surfaces are shown in Table 2.

TABLE 2

| First Surface | | | |
| --- | --- | --- | --- |
| κ: 0.000 | A: 0.173E−06 | B: −.100E−10 | C: 0.558E−15 |
| D: −.395E−19 | E: 0.433E−23 | F: −.453E−27 | G: 0.000E+00 |
| H: 0.000E+00 | J: 0.000E+00 | | |
| Fourth Surface | | | |
| κ: 0.000 | A: 0.481E−07 | B: −.587E−11 | C: 0.370E−15 |
| D: −.848E−20 | E: −.782E−24 | F: 0.550E−28 | G: 0.000E+00 |
| H: 0.000E+00 | J: 0.000E+00 | | |
| Fourteenth Surface | | | |
| κ: 0.000 | A: 0.193E−08 | B: 0.152E−11 | C: 0.266E−16 |
| D: 0.727E−20 | E: −.325E−24 | F: 0.837E−28 | G: 0.000E+00 |
| H: 0.000E+00 | J: 0.000E+00 | | |

TABLE 2-continued

| Twentieth Surface | | | |
| --- | --- | --- | --- |
| κ: 0.000 | A: 0.872E−08 | B: −.233E−11 | C: 0.121E−15 |
| D: −.929E−20 | E: 0.471E−24 | F: −.111E−28 | G: 0.000E+00 |
| H: 0.000E+00 | J: 0.000E+00 | | |
| Twenty-ninth Surface | | | |
| κ: 0.000 | A: 0.123E−10 | B: −.491E−16 | C: −.334E−20 |
| D: −.876E−25 | | | |
| Thirty-fifth Surface | | | |
| κ: 0.000 | A: 0.449E−11 | B: 0.342E−15 | C: −.635E−22 |
| D: 0.800E−25 | | | |
| Forty-third Surface | | | |
| κ: 0.000 | A: 0.393E−08 | B: 0.359E−11 | C: −.150E−15 |
| D: −.199E−19 | E: 0.554E−23 | F: −.422E−27 | G: 0.000E+00 |
| H: 0.000E+00 | J: 0.000E+00 | | |

Figure 8:
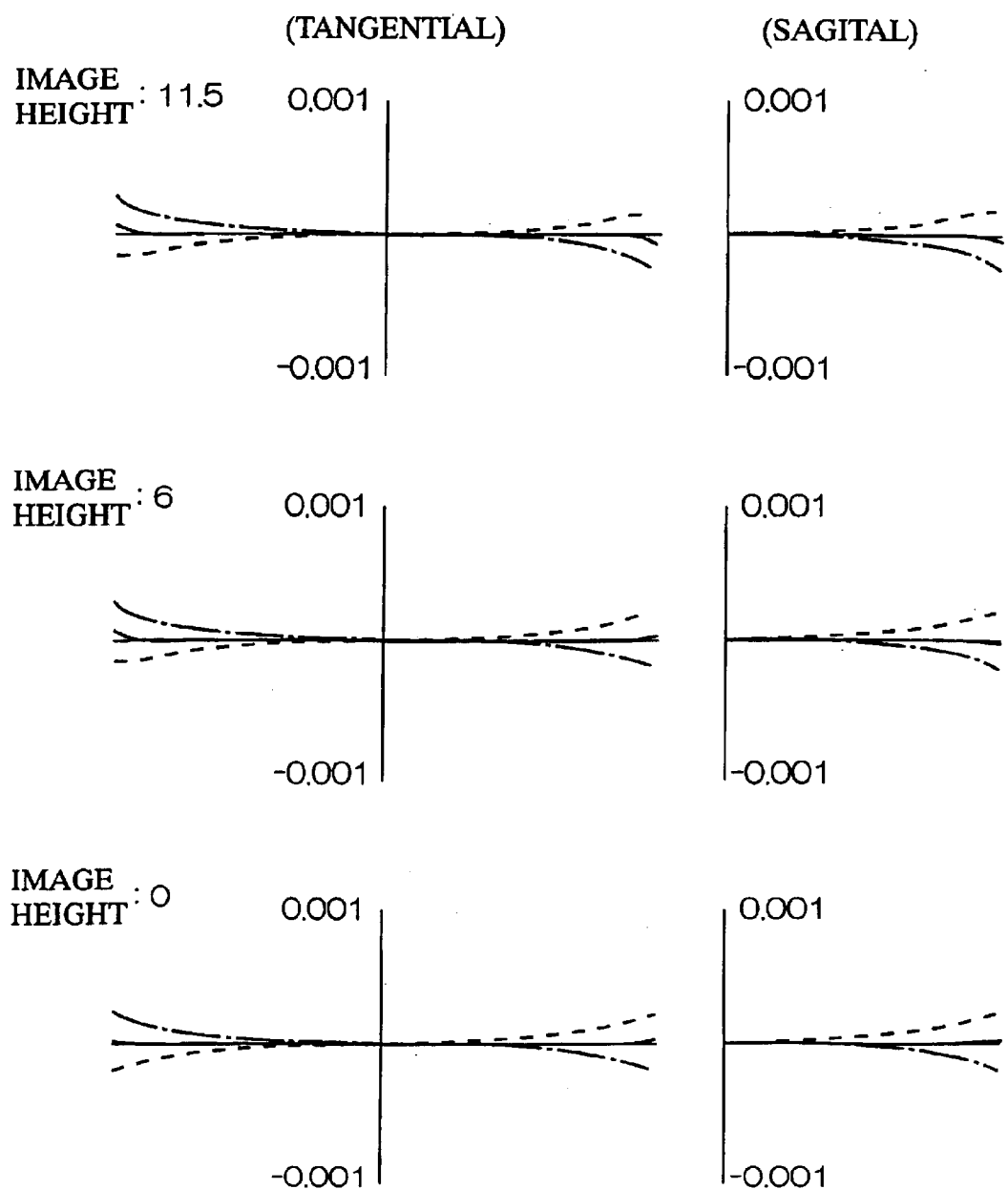
FIG. 8 is a diagram showing a transverse aberration diagram (comatic aberration diagram) in the tangential direction and the sagital direction of the projection optical system according to one embodiment of the present invention.

FIG. 8 is a diagram showing a transverse aberration diagram (comatic aberration diagram) in the tangential direction and the sagital direction in the first embodiment of the projection optical system PL according to one embodiment of the present invention. In each aberration diagram, a solid line shows a case where the wavelength of light is 157.6244 (=λ) nm, and a dotted line shows a case where the wavelength of light is λ+1.1 pm, and a dashed line shows a case where the wavelength of light is λ−1.1 pm. Here, the unit of numerical values shown in FIG. 8 is millimeter, and shown in order from the top, is a case where the height of the image on the wafer W is 11.5 mm, a case where this is 6 mm, and a case where this is 0 mm. From these aberration diagrams, it is seen that in the first embodiment, aberration is very small in the wavelength λ. Moreover, even in the case of a wavelength deviated from the wavelength λ, it is seen that a large chromatic aberration does not occur. In this case, the minimum pitch formed on the diffractive optical element D11 is 1.00 μm, and the minimum pitch formed on the diffractive optical element D12 is 1.52 μm. According to this embodiment, the image on the first plane can be formed on the second plane under suitable conditions, using extreme ultraviolet illumination light.

Figure 9:
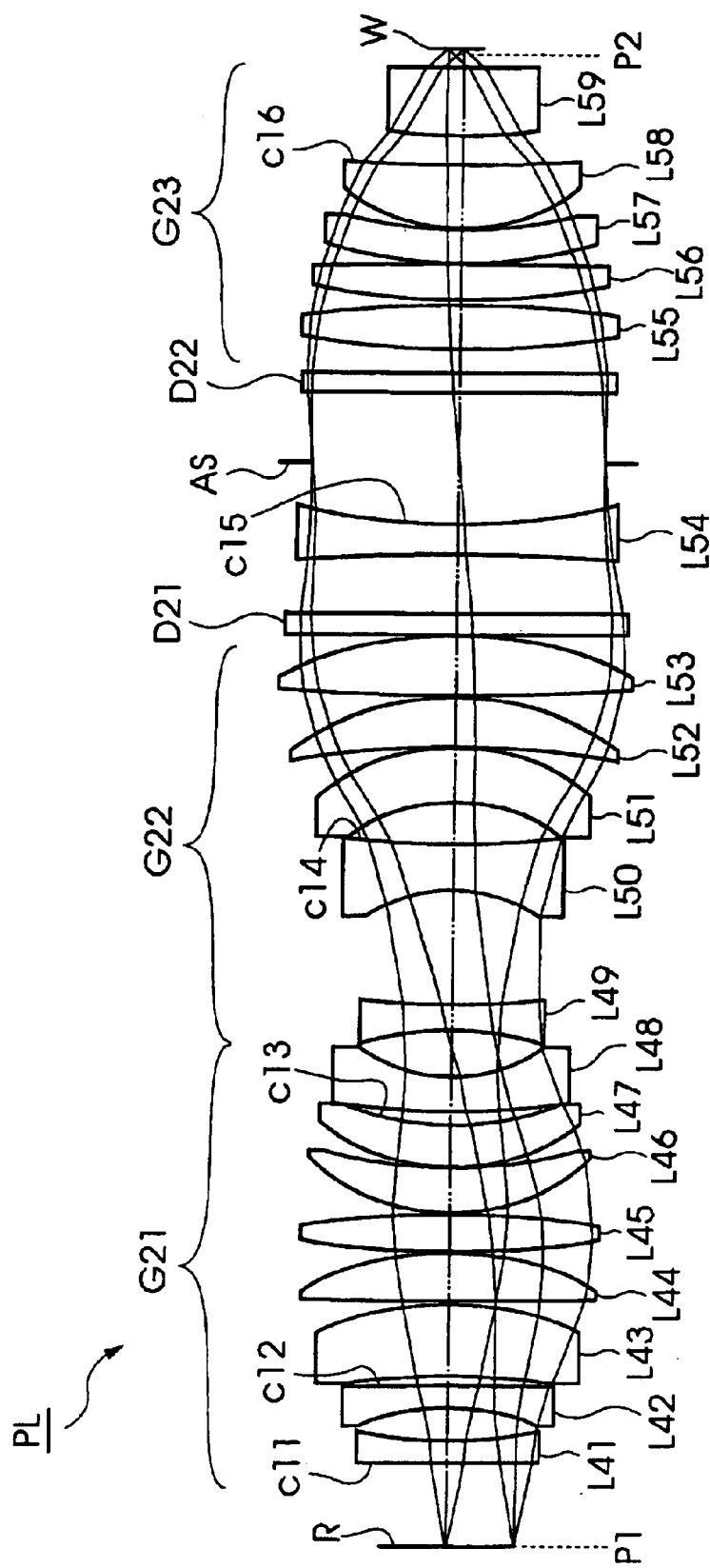
FIG. 9 is a cross-sectional view of a lens showing the optical construction of a projection optical system according to an other embodiment of the present invention.

FIG. 9 is a cross-sectional view of a lens showing the optical construction of the projection optical system PL according to an other embodiment of the present invention. The wavelength λ in this embodiment is 157.6244 nm, as in the embodiment shown in FIG. 7. In FIG. 9, the projection optical system PL is constituted by arranging, in order from a reticle R (object surface) side arranged on the first plane P1, a first lens group G21 having a positive refracting power, a second lens group G22 having a negative refracting power, a diffractive optical element D21 having a positive power, a double-concave lens L54, a diffractive optical element D22 having a positive power, and a third lens group G23 having a positive refracting power. This projection optical system is telecentric both on the reticle R (object surface) side, and on the wafer W (image surface) side arranged on the second plane P2, as in the first embodiment. The first lens group G21 and the second lens group G22 correspond to the optical system G1 in FIG. 2, the diffractive optical element D21 and the diffractive optical element D22 correspond to the diffractive optical element D1 and the diffractive optical element D2 in FIG. 2, respectively, the double-concave lens L54 corresponds to the optical system G2 in FIG. 2, and the third lens group 13 corresponds to the optical system G3 in FIG. 1.

The first lens group G21 comprises eight lenses arranged therein, in order from the first plane P1 side namely; a double-concave lens L41, a double-concave lens L12, a negative meniscus lens L42 with the concave surface facing the first plane P1 side, a positive meniscus lens L43 with the convex surface facing the second plane P2 side, a double-convex lens L44, a double-convex lens L45, a positive meniscus lens L46 with the convex surface facing the first plane P1 side, a positive meniscus lens L47 with the convex surface facing the first plane P1 side, and a negative meniscus lens L48 with the concave surface facing the second plane P2 side. Here, the surface c11 of the double-concave lens L41, the surface c12 of the double-concave lens L12 on the second plane P2 side, and the surface c13 of the positive meniscus lens L47 on the second plane P2 side are formed aspheric.

The second lens group G22 comprises five lenses arranged therein, in order from the first plane P1 side namely; a double-concave lens L49, a double-concave lens L50, a negative meniscus lens L51 with the concave surface facing the first plane P1 side, a positive meniscus lens L52 with the convex surface facing the second plane P2 side, and a double-convex lens 53. Here, the surface c14 of the double-concave lens L50 on the second plane P2 side is formed aspheric. The diffractive optical element D21 and the diffractive optical element D22 are also designed so as to have a different diffraction characteristic depending on the position thereof. As in the first embodiment, the diffractive optical element D21 and the diffractive optical element D22 are handled as with the aspheric lenses, to perform aberration calculation. Also, in this embodiment, the surface c15 of the double-concave lens L54 on the second plane P2 side, arranged between the diffractive optical element D21 and the diffractive optical element D22 is designed aspheric. Between the double-concave lens L54 and the diffractive optical element D22, there is arranged a variable aperture stop AS for determining the numerical aperture (NA) of the projection optical system PL.

The third lens group G23 comprises five lenses arranged therein, in order from the first plane P1 side namely; a double-convex lens L55, a positive meniscus lens L56 with the convex surface facing the first plane P1 side, a positive meniscus lens L57 with the convex surface facing the first plane P1 side, a positive meniscus lens L58 with the convex surface facing the first plane P1 side, and a convex plano-lens L59. Here, the surface c16 of the positive meniscus lens L58 on the second plane P2 side is formed aspheric.

Table 3 shown below is a table showing parameter values of the projection optical system PL according to the other embodiment of the present invention. The unit of numerical values shown in Table 3 is millimeter, and is rounded to three places after the decimal point. The distance from the position on the first plane P1 to the first surface c11 of the double-concave lens L41 on the first plane P1 side in FIG. 9 is set to be 55 mm, the distance from the surface of the convex plano-lens L59 on the second plane P2 side to the second plane P2 is set to be 13.000 mm, and the distance from the first plane P1 to the second plane P2 is set to be 1024 mm. Meanwhile, the focal length of the diffractive optical element D21 is 484.0 mm, and the focal length of the diffractive optical element D22 is 660.0 mm. Moreover, the value of $1/|NA\cdot\beta|$ shown in the above described expression (1) is −0.010, and the value of f/L shown in the above described expression (2) is 0.473. The glass material of each lens is fluorite, and the refractive index of fluorite in the used wavelength is 1.559, and the dispersion $(dn/d\lambda)$ is −2.605E-6/pm.

However, in Table 3, the numerical aperture of the projection optical system PL on the second plane P2 side is 0.75, with the magnification being ¼, the field image being $\phi$ 23 m, and the field of view being a rectangular shape of 22×6 mm. Moreover, in Table 3, the leftmost figure is the order of the lens surface from the first plane P1 side, r denotes a radius of curvature of the lens surface, and d denotes a space from a lens surface to the next lens surface. Also, in Table 3, in order to facilitate the arrangement of each lens, glass materials from one lens surface to the next lens surface are shown.

Furthermore, in Table 3, fluorite is mentioned as the substrate of the diffractive optical elements D21 and D22, but this substrate is not limited to fluorite, and for example, quartz or quartz having no hydroxyl group mixed therein may be used, as with the embodiment shown in FIG. 7. Moreover, the diffractive optical element D21 and the diffractive optical element D22 are designed by an ultra-high index method designating a virtual refractive index as 1001, as with the embodiment shown in FIG. 7.

TABLE 3

| Surface Number | r | d | Glass Material |
|---|---|---|---|
| 1: (asphere) | −1369.992 | 16.233 | fluorite |
| 2: | 290.313 | 21.361 | |
| 3: | −171.363 | 15.555 | fluorite |
| 4: (asphere) | −3754.999 | 7.864 | |
| 5: | −504.939 | 49.546 | fluorite |
| 6: | −203.373 | 2.176 | |
| 7: | 34133.009 | 33.313 | fluorite |
| 8: | −210.834 | 1.000 | |
| 9: | 618.914 | 25.606 | fluorite |
| 10: | −660.786 | 1.000 | |
| 11: | 149.583 | 29.844 | fluorite |
| 12: | 307.782 | 1.000 | |
| 13: | 140.106 | 29.162 | fluorite |
| 14: (asphere) | 172.830 | 9.848 | |
| 15: | 421.804 | 23.405 | fluorite |
| 16: | 103.521 | 31.676 | |
| 17: | −260.885 | 18.193 | fluorite |
| 18: | 433.853 | 80.189 | |
| 19: | −99.106 | 30.213 | fluorite |
| 20: (asphere) | 674.459 | 28.426 | |
| 21: | −124.630 | 38.330 | fluorite |
| 22: | −143.905 | 1.000 | |
| 23: | −612.558 | 32.321 | fluorite |
| 24: | −200.000 | 1.000 | |
| 25: | 1174.146 | 41.004 | fluorite |
| 26: | −292.606 | 1.000 | |
| 27: | ∞ | 15.000 | fluorite (substrate of D21) |
| 28: | ∞ | 0.000 | |
| 29: (asphere) | −484309.817 | 40.728 | (diffractive optical element D21) |
| 30: | −2397.653 | 20.257 | fluorite |
| 31: (asphere) | 360.526 | 42.700 | |
| 32: | ∞ | 48.118 | (opening AS) |
| 33: | ∞ | 13.013 | fluorite (substrate of D22) |
| 34: | ∞ | 0.000 | |
| 35: (asphere) | −659916.992 | 16.667 | (diffractive optical element D22) |
| 36: | 729.160 | 29.578 | fluorite |
| 37: | −729.160 | 3.317 | |
| 38: | 462.425 | 23.973 | fluorite |
| 39: | 14595.759 | 1.221 | |
| 40: | 315.432 | 23.545 | fluorite |
| 41: | 356.945 | 1.000 | |
| 42: | 131.719 | 43.074 | fluorite |
| 43: (asphere) | 1380.673 | 18.685 | |
| 44: | 272.686 | 45.834 | fluorite |
| 45: | ∞ | | |

Moreover, of each lens surface shown in the above Table 3, the aspherical coefficients related to the aspherical surfaces are shown in Table 4.

TABLE 4

First Surface

| | | | |
|---|---|---|---|
| κ: 0.000 | A: 0.206E−06 | B: −.182E−10 | C: 0.111E−14 |
| D: −.168E−18 | E: 0.322E−22 | F: −.349E−26 | G: 0.000E+00 |
| H: 0.000E+00 | J: 0.000E+00 | | |

Fourth Surface

| | | | |
|---|---|---|---|
| κ: 0.000 | A: 0.947E−07 | B: −.110E−10 | C: 0.306E−15 |
| D: 0.246E−19 | E: −.298E−23 | F: 0.379E−28 | G: 0.000E+00 |
| H: 0.000E+00 | J: 0.000E+00 | | |

Fourteenth Surface

| | | | |
|---|---|---|---|
| κ: 0.000 | A: −.561E−07 | B: 0.756E−12 | C: −.984E−16 |
| D: −.187E−20 | E: −.208E−24 | F: −.712E−30 | G: 0.000E+00 |
| H: 0.000E+00 | J: 0.000E+00 | | |

Twentieth Surface

| | | | |
|---|---|---|---|
| κ: 0.000 | A: 0.514E−07 | B: −.323E−11 | C: 0.376E−16 |
| D: 0.116E−19 | E: −.918E−24 | F: 0.171E−28 | G: 0.000E+00 |
| H: 0.000E+00 | J: 0.000E+00 | | |

Twenty-ninth Surface

| | | | |
|---|---|---|---|
| κ: 0.000 | A: 0.150E−10 | B: 0.717E−16 | C: 0.416E−20 |
| D: 0.528E−26 | | | |

Thirty-first Surface

| | | | |
|---|---|---|---|
| κ: 0.000 | A: −.210E−07 | B: −.117E−12 | C: −.559E−17 |
| D: 0.637E−21 | E: −.193E−26 | F: 0.578E−30 | G: 0.000E+00 |
| H: 0.000E+00 | J: 0.000E+00 | | |

Thirty-fifth Surface

| | | | |
|---|---|---|---|
| κ: 0.000 | A: 0.516E−11 | B: 0.778E−16 | C: −.158E−20 |
| D: −.948E−25 | | | |

Fourth-third Surface

| | | | |
|---|---|---|---|
| κ: 0.000 | A: −.166E−08 | B: 0.368E−11 | C: −.349E−15 |
| D: 0.361E−19 | E: −.305E−23 | F: 0.141E−27 | G: 0.000E+00 |
| H: 0.000E+00 | J: 0.000E+00 | | |

Figure 10:
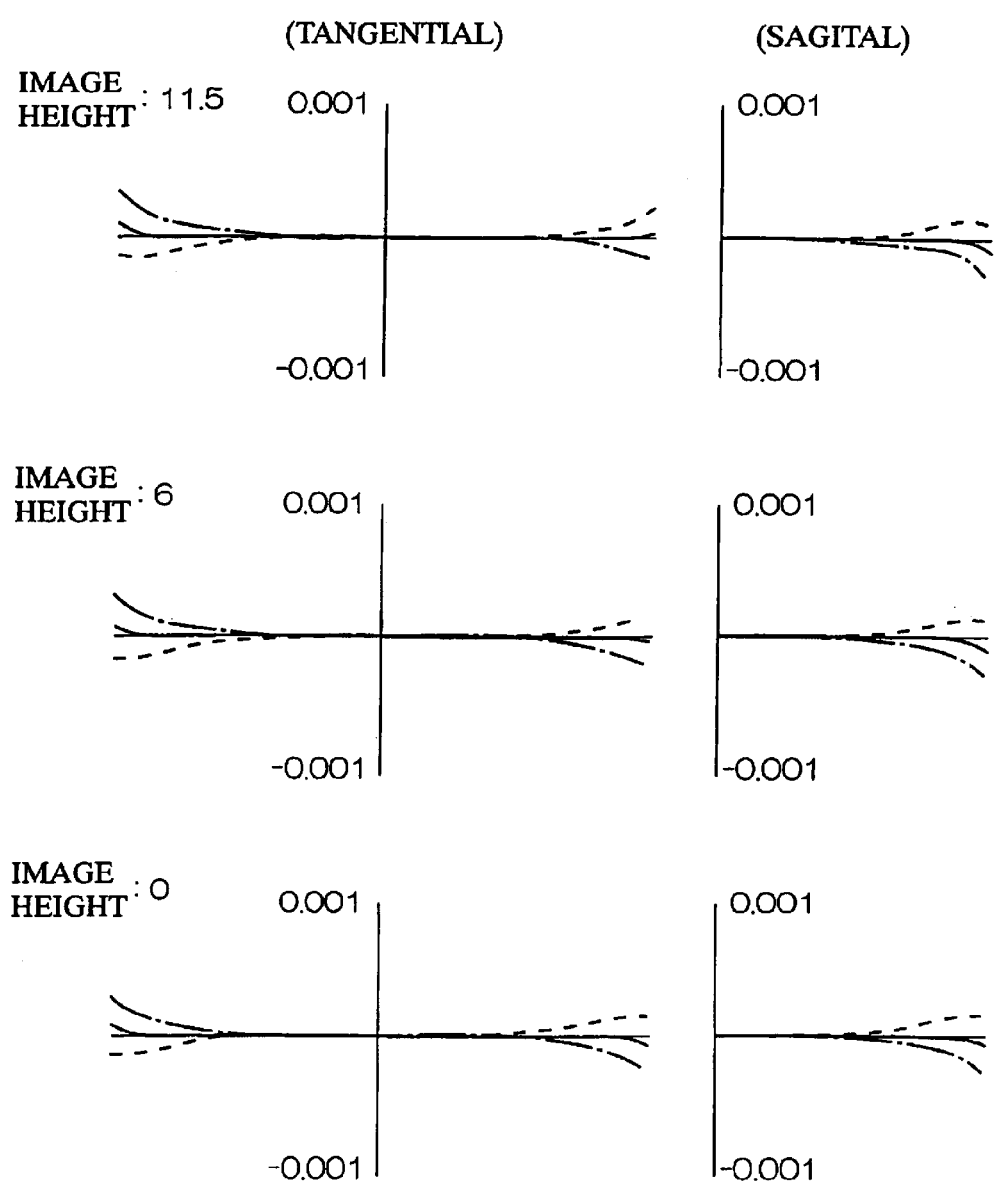
FIG. 10 is a diagram showing a transverse aberration diagram (comatic aberration diagram) in the tangential direction and the sagital direction of the projection optical system according to the other embodiment of the present invention.

FIG. 10 is a diagram showing a transverse aberration diagram (comatic aberration diagram) in the tangential direction and the sagital direction of the projection optical system PL according to the other embodiment of the present invention. In each aberration diagram, a solid line shows a case where the wavelength of light is 157.6244 (=λ) nm, and a dotted line shows a case where the wavelength of light is λ+1.1 pm, and a dashed line shows a case where the wavelength of light is λ−1.1 pm. Here, the unit of numerical values shown in FIG. 10 is millimeters, and shown in order from the top is a case where the height of the image on the wafer W is 11.5 mm, a case where this is 6 mm, and a case where this is 0 mm. From these aberration diagrams, it is seen that also in this embodiment, aberration is very small in the wavelength λ. Moreover, even in the case of a wavelength deviated from the wavelength λ, it is seen that a large chromatic aberration does not occur. In this case, the minimum pitch formed on the diffractive optical element D21 is 1.14 μm, and the minimum pitch formed on the diffractive optical element D22 is 1.20 μm. According to the above embodiment, the image on the first plane can be formed on the second plane under suitable conditions, using extreme ultraviolet illumination light.

Figure 11:
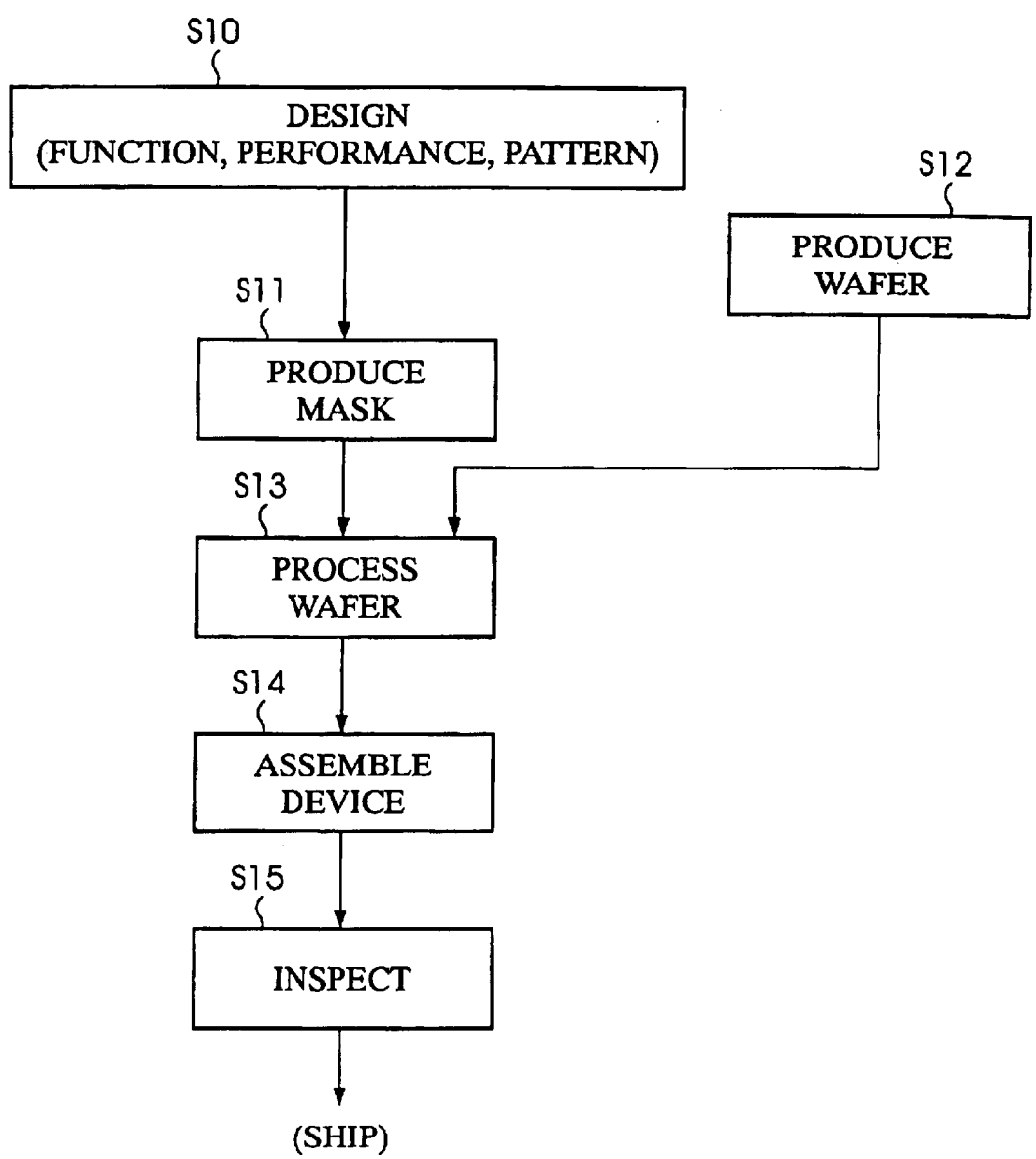
FIG. 11 is a flowchart showing a manufacturing example for micro devices.

The projection optical system PL in each embodiment of the present invention has been described above. Next, an embodiment of a manufacturing method for micro devices will be described, wherein the exposure apparatus and the exposure method according to one embodiment of the present invention are used in the lithography process. FIG. 11 is a flowchart showing a manufacturing example for micro devices (semiconductor chips such as ICs and LSIs, liquid crystal panels, CCDs, thin film magnetic heads, micro-machines, etc.). As shown in FIG. 11, at first in step S10 (designing step), designing of function and performance of micro devices (for example, circuit designing of semiconductor devices) is performed, and pattern designing is performed for realizing the function. Subsequently, in step S11 (mask production step), a mask (reticle) having the designed circuit pattern formed thereon is manufactured. On the other hand, in step S12 (wafer production step), a wafer is manufactured, using a material such as silicon.

Next, in step S13 (wafer processing step), an actual circuit or the like is formed on the wafer by a lithography technique or the like, as described below, using the mask and the wafer prepared in the steps S10 to S12. Then, in step S14 (device assembly step), a device is assembled using the wafer processed in step S13. This step S14 includes a dicing step, a bonding step and a packaging step (chip filling), according to need. Lastly, in step S15 (inspection step), inspections such as a program operation test and a durability test are performed, with respect to micro devices manufactured in step S14. Micro devices are completed through these steps, and then shipped.

Figure 12:
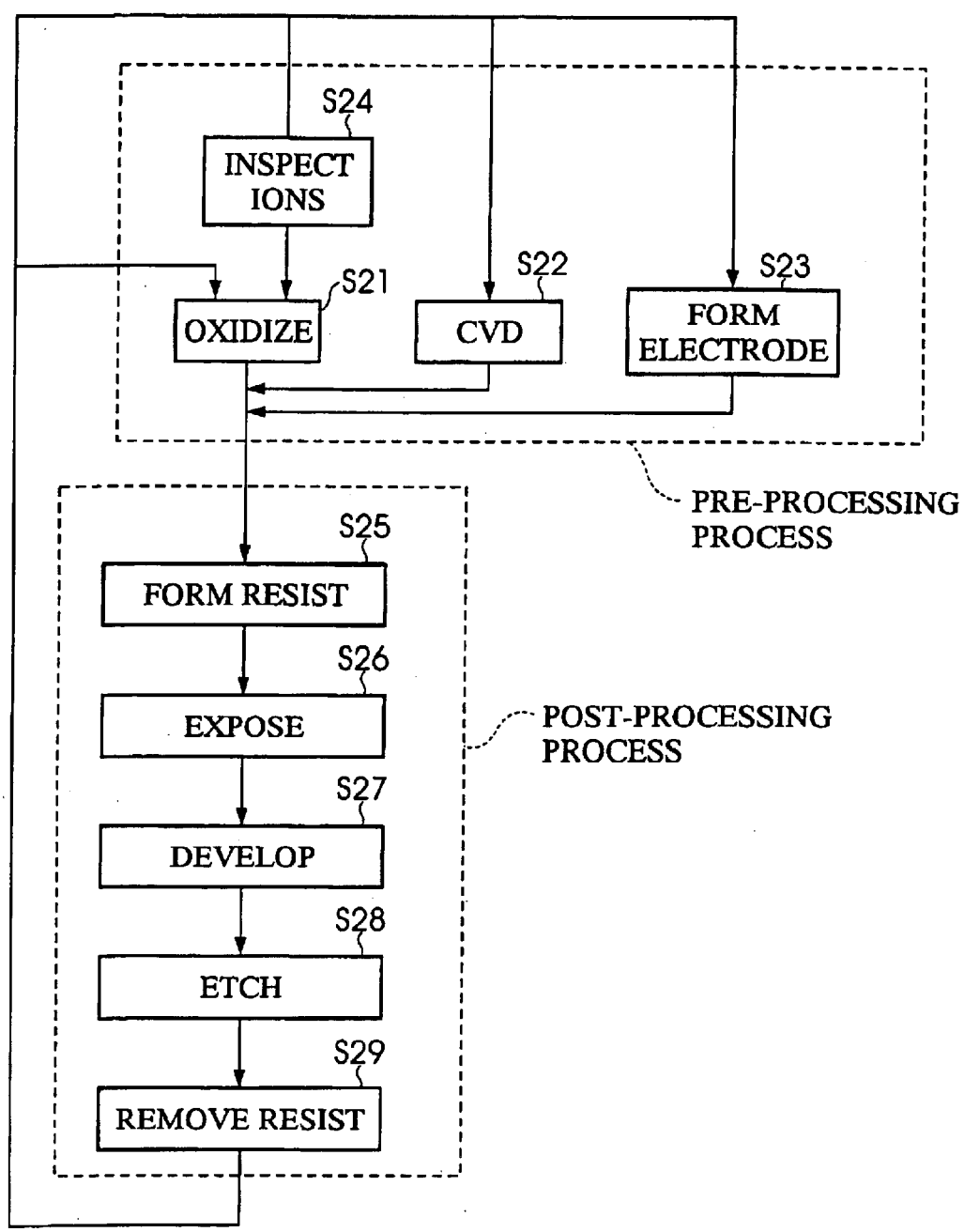
FIG. 12 is a diagram showing one example of a detailed flow in step S13 in FIG. 11, at the time of manufacturing semiconductor devices.

FIG. 12 is a diagram showing one example of a detailed flow in step S13 in FIG. 11, in the case of manufacturing semiconductor devices. In FIG. 12, in step S21 (oxidization step), the surface of the wafer is oxidized. In step S22 (CVD step), an insulation film is formed on the wafer surface. In step S23 (electrode formation step), an electrode is formed on the wafer by deposition. In step S24 (ion implantation step), ions are implanted in the wafer. Respective steps of step S21 to step S24 constitute a pre-processing process for each stage of wafer processing, which are selected according to the necessary processing in each stage and executed.

In each stage of the wafer processing, when the above described pre-processing process is completed, the post-processing process is executed in the following manner. In this post-processing process, at first in step 25 (resist formation step), a photosensitizer is applied on the wafer. Subsequently, in step 26 (exposure step), the circuit pattern on the mask is transferred onto the wafer by the above described lithography system (exposure apparatus) and exposure method. Then, in step 27 (development step), the exposed wafer is developed, and in step 28 (etching step), the exposed member in a portion other than the portion where the resist remains is removed by etching. Then, in step 29 (resist removal step), the resist which becomes unnecessary after etching has been finished, is removed. By repeating these pre-processing processes and post-processing processes, multiple circuit patterns are formed on the wafer.

If the micro device manufacturing method in this embodiment described above is used, the above described exposure apparatus and exposure method are used in the exposure step (step 26), enabling improvement in resolution by means of the exposure light in the vacuum ultraviolet region, and further, exposure amount control can be performed with high precision. As a result, highly integrated devices in which the minimum line breadth is about 0.1 μm can be manufactured at high yield.

Furthermore, the present invention is applicable to exposure apparatus in which a circuit pattern is transferred from a mother reticle to a glass substrate, a silicon wafer or the like, in order to manufacture not only micro devices such as semiconductor devices, but also a reticle or mask used in optical exposure apparatus, EUV exposure apparatus, X-ray exposure apparatus, electron beam exposure apparatus or the like. Here, in the exposure apparatus using DUV (deep ultraviolet) or VUV (vacuum ultraviolet) light, a transmission type reticle is generally used, and quartz glass, quartz glass in which fluorine is doped, fluorite, magnesium fluoride or quartz crystal is used for the reticle substrate. In the proximity type X-ray exposure apparatus or electron beam exposure apparatus, transmission type masks (stencil mask, membrane mask) are used, and a silicon wafer or the like is used for the mask substrate. Such exposure apparatus are disclosed in WO 99/34255, WO 99/50712, WO 99/66370, and Japanese Unexamined Patent Applications, First Publication Nos. Hei 11-194479, 2000-12453, 2000-29202.

Needless to say, the present invention is applicable not only to exposure apparatus used for production of semiconductor devices, but also to exposure apparatus used for production of displays including liquid crystal devices (LCDs) to transfer a device pattern onto a glass plate, exposure apparatus used for production of thin film magnetic heads to transfer a device pattern onto a ceramic wafer, and exposure apparatus used for production of imaging elements such as CCDs.

What is claimed is:

1. A projection optical system which forms an image of a first plane on a second plane, comprising:
   a first diffractive optical element arranged in an optical path between said first plane and said second plane;
   a second diffractive optical element arranged in the optical path on the side of said second plane from said first diffractive optical element;
   an optical system having a negative power, arranged in the optical path between said first diffractive optical element and said second diffractive optical element;
   a first space formed in an optical path between said first diffractive optical element and said optical system; and
   a second space formed in an optical path between said optical system and said second diffractive optical element.

2. A projection optical system according to claim 1, further comprising:
   a front optical system arranged between said first plane and said first diffractive optical element; and
   a rear optical system arranged between said second diffractive optical element and said second plane;
   and said front optical system converts an axial luminous flux on said first plane to a substantially parallel luminous flux, and guides said parallel luminous flux to said first diffractive optical element; and
   said optical system having a negative power converts an axial luminous flux on said first plane via said first diffractive optical element again to a substantially parallel luminous flux, and guides said parallel luminous flux to said second diffractive optical element.

3. A projection optical system according to claim 1, wherein all the diffraction patterns of said diffraction optical elements are formed on a flat substrate.

4. A projection optical system according to claim 1, wherein diffraction patterns of said diffractive optical elements are formed in a plurality of ring areas centered on an optical axis, said each ring area being formed of a binary optical element approximated in a plurality of stages by a plurality of surfaces, and said binary optical element formed in said each ring area has a positive power, respectively.

5. A projection optical system according to claim 4, wherein at least one stage number of the binary optical elements respectively formed in said each ring area is different from the stage number of other binary optical elements.

6. A projection optical system according to claim 4, wherein a filter having a different transmittance according to each ring area is arranged in the vicinity of at least one of said first diffractive optical element and said second diffractive optical element.

7. A projection optical system according to claim 1, wherein the diffraction patterns of said diffractive optical elements are formed in a plurality of ring areas centered on an optical axis, each of said respective ring areas having a sawtooth cross-section having a positive power.

8. A projection optical system according to claim 7, wherein the diffraction pattern of said diffractive optical element is formed in a first ring area and a second ring area, centered on a mutual optical axis, said first ring area being formed on the side of the optical axis from said second ring area, and having a sawtooth cross-section in which the diffraction efficiency becomes highest with regard to the 1st or −1st diffracted light, and said second ring area being formed on the side of the periphery from said first ring area, and having a sawtooth cross-section in which the diffraction efficiency becomes highest with regard to the mth or −mth diffracted light (m is an integer equal to or greater than 2).

9. A projection optical system according to claim 1, wherein said plurality of optical elements constituting said projection optical system have lenses contributing to forming an image on the first plane on the second plane, and all the lenses constituting said projection optical system are constituted of fluorite.

10. A projection optical system according to claim 1, wherein said optical system having a negative power has an aspheric surface.

11. An exposure apparatus comprising:
    a mask stage for setting a mask having a predetermined pattern formed thereon on a first plane;
    a substrate stage which sets a photosensitive substrate on a second plane;
    an illumination optical system which illuminates said mask set on said first plane; and
    a projection optical system according to claim 1, which performs projection exposure of a pattern image of said mask on said photosensitive substrate.

12. A manufacturing method of micro devices including:
    a first setting step for setting a mask having a predetermined pattern on a first plane;
    a second setting step for setting a photosensitive substrate on a second plane;
    an illumination step for illuminating said mask;
    an exposure step for performing projection exposure of a pattern image of said mask onto said photosensitive substrate, using a projection optical system according to claim 1; and
    a development step for developing said photosensitive substrate to which said image has been transferred.

13. A projection optical system which forms an image on a first plane on a second plane, comprising:
    a diffractive optical element arranged in an optical path between said first plane and said second plane; and
    an optical system arranged in the optical path between said first plane and said diffractive optical element;
    wherein when a numerical aperture on the side of said second plane of said projection optical system is designated as NA, an imaging magnification of said optical systems from said first plane to immediately before said diffractive optical element is designated as β, the focal length of said diffractive optical element with respect to a predetermined wavelength is designated as f, and the distance from said first plane to said second plane is designated as L, said projection optical system satisfies the following conditions:

$1/|NA≈β|<0.7$ $0.38<f/L<1.2.$

14. A projection optical according to claim 13, wherein an optical system having a positive power is arranged in the optical path between said diffractive optical element and said second plane, and said optical system arranged in the optical path between said first plane and said diffractive optical element has a positive power.

15. An exposure apparatus comprising:

a mask stage which sets a mask having a predetermined pattern formed thereon on a first plane;

a substrate stage which sets a photosensitive substrate on a second plane;

an illumination optical system which illuminates said mask set on said first plane; and a projection optical system according to claim 13, which performs projection exposure of a pattern image of said mask on said photosensitive substrate.

16. A manufacturing method of micro devices including:

a first setting step for setting a mask having a predetermined pattern on a first plane;

a second setting step for setting a photosensitive substrate on a second plane;

an illumination step for illuminating said mask;

an exposure step for performing projection exposure of a pattern image of said mask onto said photosensitive substrate, using a projection optical system according to claim 13; and a development step for developing said photosensitive substrate to which said image has been transferred.

* * * * *

UNITED STATES PATENT AND TRADEMARK OFFICE
CERTIFICATE OF CORRECTION

PATENT NO. : 6,903,803 B2  
DATED : June 7, 2005  
INVENTOR(S) : Yasuhiro Omura

Page 1 of 1

It is certified that error appears in the above-identified patent and that said Letters Patent is hereby corrected as shown below:

<u>Column 27,</u>  
Line 4, "optical according" should read -- optical system according --.

Signed and Sealed this

Twenty-third Day of August, 2005

JON W. DUDAS  
*Director of the United States Patent and Trademark Office*